(12) United States Patent
Shin et al.

(10) Patent No.: US 12,176,460 B2
(45) Date of Patent: Dec. 24, 2024

(54) PIXEL AND DISPLAY DEVICE INCLUDING THE SAME

(71) Applicant: Samsung Display Co., LTD., Yongin-si (KR)

(72) Inventors: Min Gyeong Shin, Yongin-si (KR); Dong Woo Kim, Yongin-si (KR); Se Hyun Lee, Yongin-si (KR); Hak Sun Chang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 524 days.

(21) Appl. No.: 17/522,503

(22) Filed: Nov. 9, 2021

(65) Prior Publication Data

US 2022/0336707 A1 Oct. 20, 2022

(30) Foreign Application Priority Data

Apr. 15, 2021 (KR) .................. 10-2021-0049357

(51) Int. Cl.
*H01L 33/38* (2010.01)
*H01L 27/15* (2006.01)
*H01L 33/62* (2010.01)

(52) U.S. Cl.
CPC .......... *H01L 33/382* (2013.01); *H01L 27/156* (2013.01); *H01L 33/62* (2013.01)

(58) Field of Classification Search
CPC ... H01L 25/0753; H01L 33/62; H01L 27/156; H01L 33/382; H01L 33/507; H01L 33/20; H01L 25/167; H01L 33/44
See application file for complete search history.

(56) References Cited

U.S. PATENT DOCUMENTS 8,728,860 B2 * 5/2014 Yamazaki ......... H01L 21/02631
257/E21.459
8,901,691 B2 * 12/2014 Yeo ...................... G06F 3/0412
257/E31.093

(Continued)

FOREIGN PATENT DOCUMENTS

KR 10-2018-0009014 1/2018
KR 10-2018-0011404 2/2018

(Continued)

*Primary Examiner* — Jarrett J Stark
(74) *Attorney, Agent, or Firm* — KILE PARK REED & HOUTTEMAN PLLC

(57) ABSTRACT

A pixel includes a first conductive pattern, a second conductive pattern, and a third conductive pattern that are spaced apart from each other; a first electrode at least partially overlapping and directly contacting the first conductive pattern; a second electrode adjacent to the first electrode; a third electrode on the third conductive pattern and directly contacting the third conductive pattern, and a fourth electrode at least partially overlapping, and directly contacting the second conductive pattern; a first pixel electrode and a second pixel electrode that are on at least one of the first, second, third, and fourth electrodes; and light emitting elements electrically connected to the first and second pixel electrodes. The first conductive pattern, the first electrode, and the first pixel electrode are electrically connected to each other. The third conductive pattern, the third electrode, and the second pixel electrode are electrically connected to each other.

19 Claims, 15 Drawing Sheets

(56) References Cited

U.S. PATENT DOCUMENTS

| | | | |
|---|---|---|---|
| 10,249,603 B2 | 4/2019 | Cho et al. | |
| 10,276,630 B2 | 4/2019 | Lee et al. | |
| 10,340,419 B2 | 7/2019 | Kim et al. | |
| 10,971,529 B2* | 4/2021 | Li | H10K 59/1275 |
| 2020/0043949 A1* | 2/2020 | Lee | H01L 27/1222 |
| 2020/0212110 A1* | 7/2020 | Ryu | H10K 50/828 |
| 2020/0258938 A1 | 8/2020 | Chai et al. | |
| 2021/0217739 A1 | 7/2021 | Lee et al. | |
| 2022/0181522 A1* | 6/2022 | Moon | H01L 27/124 |
| 2022/0204796 A1* | 6/2022 | Jung | H01L 25/0753 |

FOREIGN PATENT DOCUMENTS

| | | |
|---|---|---|
| KR | 10-1987196 | 6/2019 |
| KR | 10-2020-0006209 | 1/2020 |
| KR | 10-2020-0027136 | 3/2020 |
| KR | 10-2020-0097869 | 8/2020 |
| WO | 2020189924 | 9/2020 |
| WO | 2020213832 | 10/2020 |

\* cited by examiner

PIXEL AND DISPLAY DEVICE INCLUDING THE SAME

CROSS-REFERENCE TO RELATED APPLICATION(S)

This application claims priority to and benefits of Korean Patent Application 10-2021-0049357 under 35 U.S.C. § 119, filed on Apr. 15, 2021, in the Korean Intellectual Property Office, the entire contents of which are incorporated herein by reference.

BACKGROUND

1. Technical Field

The disclosure relates to a pixel and a display device including the same.

2. Related Art

As interest in information displays and demand for portable information media increase, research and commercialization has focused on display devices.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a pixel having improved reliability and a display device including the pixel.

In an embodiment, a pixel may include a first conductive pattern, a second conductive pattern, and a third conductive pattern, that are spaced apart from each other; a first electrode at least partially overlapping the first conductive pattern, and directly contacting the first conductive pattern, a second electrode adjacent to the first electrode, a third electrode which is adjacent to the second electrode, the third electrode disposed on the third conductive pattern, and directly contacting the third conductive pattern; and a fourth electrode adjacent to the third electrode, the fourth electrode at least partially overlapping the second conductive pattern, and directly contacting the second conductive pattern; a first pixel electrode and a second pixel electrode, that are disposed on at least one of the first electrode, the second electrode, the third electrode and the fourth electrode, the first pixel electrode and the second pixel electrode, being spaced apart from each other; and light emitting elements electrically connected to the first and second pixel electrodes. The first conductive pattern, the first electrode, and the first pixel electrode are electrically connected to each other. The third conductive pattern, the third electrode, and the second pixel electrode are electrically connected to each other.

In an embodiment, a pixel may include: a first bank pattern located between the first conductive pattern and the first electrode, the first bank pattern overlapping each of the first conductive pattern and the first electrode; a second bank pattern located below the second electrode and third electrode, the second bank pattern overlapping each of the second electrode and the third electrode; a third bank pattern located between the second conductive pattern and the fourth electrode, the third bank pattern overlapping each of the second conductive pattern and the fourth electrode; and an insulating layer disposed on the first electrode, the second electrode, the third electrode, and the fourth electrode.

In an embodiment, a pixel may include an emission area in which the light emitting elements are disposed; a non-emission area adjacent to the emission area; and a bank disposed in the non-emission area, the bank including a first opening corresponding to the emission area and a second opening spaced apart from the first opening. at least a portion of the first conductive pattern and at least a portion of the first electrode may be separated in the second opening. At least a portion of the second conductive pattern and at least a portion of the fourth electrode may be separated in the second opening.

In an embodiment, the first conductive pattern may overlap at least a portion of the first electrode, may extend along an extending direction of the first electrode, and may be adjacent to the bank in the emission area. The second conductive pattern may be spaced apart from the first conductive pattern, may overlap at least a portion of the fourth electrode, may extend along an extending direction of the fourth electrode, and may be adjacent to the bank.

In an embodiment, the insulating layer may include a first contact hole exposing a portion of the first conductive pattern; and a second contact hole exposing a portion of the third electrode. The first contact hole may be located in the first opening. The second contact hole may be located in the second opening.

In an embodiment, before the light emitting elements are disposed in the emission area, a first alignment signal may be applied to the first conductive pattern, the first electrode, the second conductive pattern, and the fourth electrode. Before the light emitting elements are disposed in the emission area, a second alignment signal may be applied to the second electrode and the third electrode.

In an embodiment, the first alignment signal and the second alignment signal may be different from each other. The second alignment signal may be an AC signal. The first alignment signal may be a ground voltage.

In an embodiment, the pixel may include at least one transistor disposed on a substrate; at least one power line disposed on the substrate, the at least one power line being supplied with a predetermined power source; and a passivation layer disposed over the at least one transistor and the at least one power line, the passivation layer including a first contact part exposing a portion of the at least one transistor and a second contact part exposing a portion of the at least one power line.

In an embodiment, at least a portion of the first conductive pattern may overlap the first contact part. The third conductive pattern may overlap the second contact part.

In an embodiment, the first conductive pattern may be electrically connected to the at least one transistor through the first contact part. The third conductive pattern may be electrically connected to the at least one power line through the second contact part.

In an embodiment, the first electrode may be electrically connected to the at least one transistor and may directly contact the first conductive pattern. The third electrode may be electrically connected to the power line and may directly contact the third conductive pattern.

In an embodiment, the first contact part and the second contact part may overlap the bank.

In an embodiment, the pixel may further include a color conversion layer located above the light emitting elements, the color conversion layer converting light of a first color into light of a second color, the light of a first color being emitted from the light emitting elements; and a color filter located on the top of the color conversion layer. The light of the second color may selectively transmit through the color filter.

In an embodiment, the pixel may include an intermediate electrode disposed on the insulating layer, the intermediate electrode being spaced apart from the first pixel electrode and the second pixel electrode.

In an embodiment, the intermediate electrode may include a first intermediate electrode, a second intermediate electrode, and a third intermediate electrode, which are disposed to be spaced apart from each other. At least one of the first intermediate electrode, the second intermediate electrode, and the third intermediate electrode, and at least one of the first pixel electrode and the second pixel electrode may be disposed on the same layer.

In an embodiment, the light emitting elements may include a first light emitting element disposed between the first pixel electrode and the first intermediate electrode, the first light emitting element being electrically connected to the first pixel electrode and the first intermediate electrode; a second light emitting element disposed between the first intermediate electrode and the second intermediate electrode, the second light emitting element being electrically connected to the first intermediate electrode and the second intermediate electrode; a third light emitting element disposed between the second intermediate electrode and the third intermediate electrode, the third light emitting element being electrically connected to the second intermediate electrode and the third intermediate electrode; and a fourth light emitting element disposed between the third intermediate electrode and the second pixel electrode, the fourth light emitting element being electrically connected to the third intermediate electrode and the second pixel electrode.

In an embodiment, the intermediate electrode may include a first intermediate electrode, a second intermediate electrode adjacent to the second pixel electrode, and a connection electrode connecting the first intermediate electrode and the second intermediate electrode to each other. The first intermediate electrode, the second intermediate electrode, and the connection electrode may be integral with each other.

In an embodiment, the light emitting elements may include a first light emitting element disposed between the first pixel electrode and the first intermediate electrode, the first light emitting element being electrically connected to the first pixel electrode and the first intermediate electrode; and a second light emitting element disposed between the second intermediate electrode and the second pixel electrode, the second light emitting element being electrically connected to the second intermediate electrode and the second pixel electrode.

In an embodiment, a display device may include a substrate on which a plurality of pixel areas each including an emission area and a non-emission area are provided; and a pixel located in each of the pixel areas. The pixel may include: a first conductive pattern, a second conductive pattern, and a third conductive pattern, spaced from each other on the substrate; a first electrode at least partially overlapping the first conductive pattern, and directly contacting the first conductive pattern; a second electrode adjacent to the first electrode; a third electrode which is adjacent to the second electrode, the third electrode disposed on the third conductive pattern, and directly contacting the third conductive pattern; and a fourth electrode which is adjacent to the third electrode, and partially overlapping the second conductive pattern, and directly contacting the second conductive pattern; an insulating layer covering the first electrode, the second electrode, the third electrode, and the fourth electrode, the insulating layer including a first contact hole exposing a portion of the first conductive pattern, and a second contact hole exposing a portion of the third electrode; a bank located on the insulating layer of the non-emission area, the bank having a first opening corresponding to the emission area and a second opening spaced apart from the first opening; a first pixel electrode and a second pixel electrode disposed on the insulating layer, the first pixel electrode and the second pixel electrode, spaced apart from each other; an intermediate electrode spaced apart from the first pixel electrode and from the second pixel electrode; and light emitting elements electrically connected to the first pixel electrode, to the second pixel electrode, and to the intermediate electrode. The first conductive pattern, the first electrode, and the first pixel electrode are electrically connected to each other. The third conductive pattern, the third electrode, and the second pixel electrode are electrically connected to each other.

In an embodiment, the first conductive pattern may extend to be adjacent to the bank in the emission area. The second conductive pattern may be spaced apart from the first conductive pattern and may be adjacent to the bank in the emission area. The first pixel electrode may at least partially overlap the first conductive pattern, and may directly contact the first conductive pattern through the first contact hole.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE EMBODIMENTS

Figure 1:
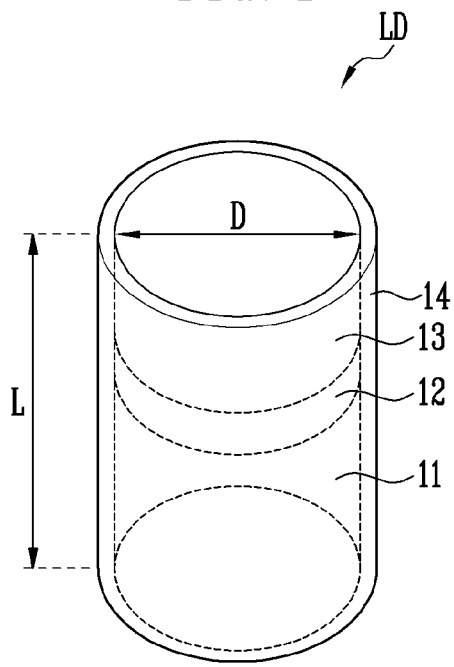
FIGS. 1 and 2 are perspective views schematically illustrating a light emitting element in accordance with an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Like numbers refer to like elements throughout. In the drawings, the thickness of certain lines, layers, components, elements, or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate, or plate is placed "on" or "above" another element indicates not only a case where the element is placed "directly on" or "just above" the other element but also a case where a further element is interposed between the element and the other element. On the contrary, an expression that an element such as a layer, region, substrate, or plate is placed "beneath" or "below" another element indicates not only a case where the element is placed "directly beneath" or "just below" the other element but also a case where a further element is interposed between the element and the other element.

In this specification, it will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. Also, in this specification, the term "connection" or "coupling" may inclusively mean a physical and/or electrical connection or coupling.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

It will be understood that when an element (or a region, a layer, a portion, or the like) is referred to as "being on", "connected to" or "coupled to" another element in the specification, it can be directly disposed on, connected, or coupled to another element mentioned above, or intervening elements may be disposed therebetween.

It will be understood that the terms "connected to" or "coupled to" may include a physical or electrical connection or coupling.

Hereinafter, embodiments of the disclosure and items required for those skilled in the art to easily understand the content of the disclosure will be described in detail with reference to the accompanying drawings. In the following description, singular forms in the disclosure are intended to include the plural forms as well, unless the context clearly indicates otherwise.

Figure 2:
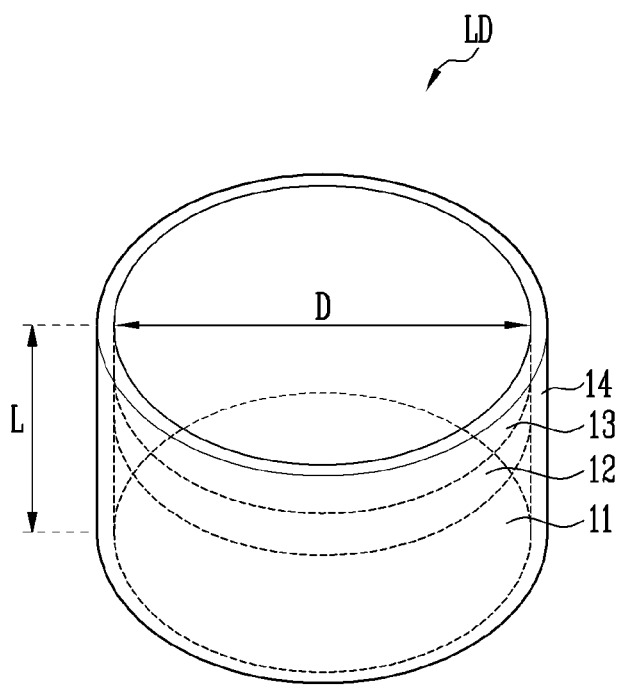
Figure 3:
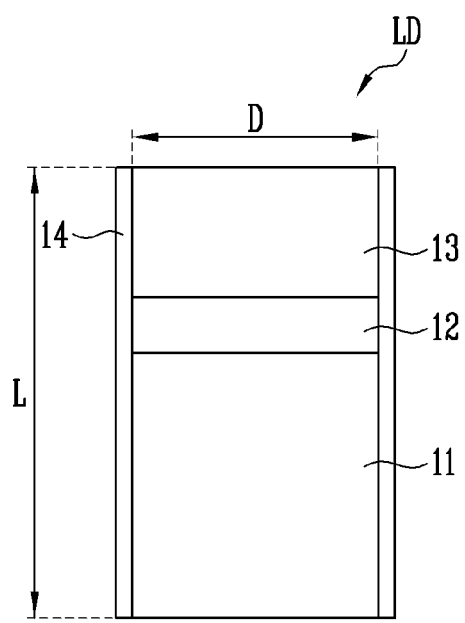
FIG. 3 is a schematic cross-sectional view of the light emitting element shown in FIG. 1.

FIGS. 1 and 2 are perspective views schematically illustrating a light emitting element LD in accordance with an embodiment of the disclosure. FIG. 3 is a schematic cross-sectional view of the light emitting element LD shown in FIG. 1.

In an embodiment of the disclosure, the kind and/or shape of the light emitting element LD is not limited to the embodiment shown in FIGS. 1 to 3.

Referring to FIGS. 1 to 3, the light emitting element LD may include a first semiconductor layer 11, a second semiconductor layer 13, and an active layer 12 interposed between the first and second semiconductor layers 11 and 13. For example, the light emitting element LD may be implemented with a light emitting stack structure (or stack structure) in which the first semiconductor layer 11, the active layer 12, and the second semiconductor layer 13 are sequentially stacked.

The light emitting element LD may be provided in a shape extending in one direction. When assuming that an extending direction of the light emitting element LD is a length direction, the light emitting element LD may include an end portion (or lower end portion) and another end portion (or upper end portion) along the extending direction. Any one of the first and second semiconductor layers 11 and 13 may be disposed at the one end portion of the light emitting element LD, and the other of the first and second semiconductor layers 11 and 13 may be disposed at the other end portion of the light emitting element LD. For example, the first semiconductor layer 11 may be disposed at the one end portion of the light emitting element LD, and the second semiconductor layer 13 may be disposed at the other end portion of the light emitting element LD.

The light emitting element LD may be provided in various shapes. For example, the light emitting element LD may have a rod-like shape, a bar-like shape, a pillar-like shape, or the like, which is long in its length direction (i.e., its aspect ratio is greater than 1) as shown in FIG. 1. In an embodiment, a length L of the light emitting element LD in the length direction may be larger than a diameter D (or a width of a cross-section) of the light emitting element LD. However, the disclosure is not limited thereto. In some embodiments, the light emitting element LD may have a rod-like shape, a bar-like shape, a pillar-like shape, or the like, which is short in its length direction (i.e., its aspect ratio is smaller than 1) as shown in FIG. 2. Also, in some embodiments, the light emitting element LD may have a rod-like shape, a bar-like shape, a pillar-like shape, or the like, of which a length L and a diameter D are the same.

The light emitting element LD may include, for example, a light emitting diode (LED) fabricated small enough to have a diameter D and/or a length L in the nanometer to micrometer range.

When the light emitting element LD is long in its length direction (i.e., its aspect ratio is greater than 1), the diameter D of the light emitting element LD may be about 0.5 μm to about 6 μm, and the length L of the light emitting element LD may be about 1 μm to about 10 μm. However, the diameter D and the length L of the light emitting element LD are not limited thereto, and the size of the light emitting element LD may be changed according to requirement conditions (or design conditions) of a lighting device or a self-luminous display device, to which the light emitting element LD is applied.

The first semiconductor layer 11 may include, for example, at least one n-type semiconductor layer. For example, the first semiconductor layer 11 may include any semiconductor material among InAlGaN, GaN, AlGaN, InGaN, AlN, and InN, and include an n-type semiconductor layer doped with a first conductive dopant (or n-type dopant) such as Si, Ge, or Sn. However, the material constituting the first semiconductor layer 11 is not limited thereto. The first semiconductor layer 11 may be configured with various materials. The first semiconductor layer 11 may include an upper surface that contacts the active layer 12 and a lower surface exposed to the outside along the length direction of the light emitting element LD. The lower surface of the first semiconductor layer 11 may be an end portion (or lower end portion) of the light emitting element LD.

The active layer 12 is formed on the first semiconductor layer 11, and may be formed in a single or multiple quantum well structure. For example, when the active layer 12 is formed in the multiple quantum well structure, a barrier layer (not shown), a strain reinforcing layer, and a well layer, which constitute one unit, may be periodically and repeatedly stacked in the active layer 12. The strain reinforcing layer may have a lattice constant smaller than that of the barrier layer, to further reinforce strain, e.g., compressive strain applied to the well layer. However, the structure of the active layer 12 is not limited to the above-described embodiment.

The active layer 12 may emit light having a wavelength of 400 nm to 900 nm, and use a double hetero structure. In an embodiment, a clad layer (not shown) doped with a conductive dopant may be formed on the top and/or the bottom of the active layer 12 along the length direction of the light emitting element LD. For example, the clad layer may be formed as an AlGaN layer or InAlGaN layer. In some embodiments, a material such as AlGaN or AlInGaN may be used to form the active layer 12. The active layer 12 may be configured with various materials. The active layer 12 may include a first surface that contacts the first semiconductor layer 11 and a second surface that contacts second semiconductor layer 13.

When an electric field is applied to both the end portions of the light emitting element LD, the light emitting element LD emits light as electron-hole pairs are combined in the active layer 12. The light emission of the light emitting element LD is controlled by using such a principle, so that the light emitting element LD may be used as a light source (or light emitting source) for various light emitting devices, including a pixel of a display device.

The second semiconductor layer 13 is formed on the second surface of the active layer 12, and may include a semiconductor layer of a type different from that of the first semiconductor layer 11. For example, the second semiconductor layer 13 may include at least one p-type semiconductor material. For example, the second semiconductor layer 13 may include at least one semiconductor material among InAlGaN, GaN, AlGaN, InGaN, AlN, and InN, and include a p-type semiconductor layer doped with a second conductive dopant (or p-type dopant) such as Mg, Zn, Ca, Sr, or Ba. However, the material constituting the second semiconductor layer 13 is not limited thereto. The second semiconductor layer 13 may be configured with various materials. The second semiconductor layer 13 may include a lower surface that contacts the second surface of the active layer 12 and an upper surface exposed to the outside along the length direction of the light emitting element LD. The upper surface of the second semiconductor layer 13 may be the other end portion (or upper end portion) of the light emitting element LD.

In an embodiment, the first semiconductor layer 11 and the second semiconductor layer 13 may have different thicknesses in the length direction of the light emitting element LD. For example, the first semiconductor layer 11 may have a thickness relatively thicker than that of the second semiconductor layer 13 along the length direction of the light emitting element LD. Accordingly, the active layer 12 of the light emitting element LD may be located more adjacent to the upper surface of the second semiconductor layer 13 than the lower surface of the first semiconductor layer 11.

Although each of the first semiconductor layer 11 and the second semiconductor layer 13 are each illustrated as a single layer, the disclosure is not limited thereto. In an embodiment, each of the first semiconductor layer 11 and the second semiconductor layer 13 may further include at least one layer, e.g., a clad layer and/or a Tensile Strain Barrier Reducing (TSBR) layer according to the material of the active layer 12. The TSBR layer may be a strain reducing layer disposed between semiconductor layers having different lattice structures to perform a buffering function for reducing a lattice constant difference. The TSBR may be configured with a p-type semiconductor layer such as p-GaInP, p-AlInP or p-AlGaInP, but the disclosure is not limited thereto.

In some embodiments, the light emitting element LD may further include a contact electrode (not shown) (hereinafter, referred to as a "first contact electrode") disposed on the top of the second semiconductor layer 13, in addition to the first semiconductor layer 11, the active layer 12, and the second semiconductor layer 13. In other embodiments, the light emitting element LD may further include another contact electrode (not shown) (hereinafter, referred to as a "second contact electrode") disposed at one end of the first semiconductor layer 11.

The first and second contact electrodes may be ohmic contact electrodes, but the disclosure is not limited thereto. In some embodiments, the first and second contact electrodes may be Schottky contact electrodes. The first and second contact electrodes may include a conductive material. For example, the first and second contact electrodes may include an opaque metal using one or mixture of chromium (Cr), titanium (Ti), aluminum (Al), gold (Au), nickel (Ni), and any oxide or alloy thereof, but the disclosure is not limited thereto. In some embodiments, the first and second contact electrodes may include a transparent conductive oxide such as indium tin oxide (ITO), indium zinc oxide (IZO), zinc oxide (ZnO), indium gallium zinc oxide (IGZO), or indium tin zinc oxide (ITZO).

Materials respectively included in the first and second contact electrodes may be identical to or different from each other. The first and second contact electrodes may be substantially transparent or translucent. Accordingly, light generated in the light emitting element LD may be emitted to the outside of the light emitting element LD by passing through the first and second contact electrodes. In some embodiments, when light generated in the light emitting element LD does not pass through the first and second contact electrodes and is emitted to the outside through an area other than the end portions of the light emitting element LD, the first and second contact electrodes may include an opaque metal.

In an embodiment of the disclosure, the light emitting element LD may further include an insulating film 14. However, in some embodiments, the insulating film 14 may be omitted, and be provided to cover only portions of the first semiconductor layer 11, the active layer 12, and the second semiconductor layer 13.

The insulating film 14 may prevent an electrical short circuit which may occur when the active layer 12 contacts a conductive material in addition to the first semiconductor layer 11 and the second semiconductor layer 13. Also, the insulating film 14 minimizes a surface defect of the light emitting element LD, thereby improving the lifespan and light emission efficiency of the light emitting element LD. Also, when light emitting elements LD are densely disposed, the insulating film 14 may prevent an unwanted short circuit which may occur between the light emitting elements LD. Whether the insulating film is provided is not limited as long as the active layer 12 may prevent occurrence of a short circuit with external conductive material.

The insulating film 14 may be provided in a shape entirely surrounding the outer circumference of the light emitting stack structure including the first semiconductor layer 11, the active layer 12, and the second semiconductor layer 13.

Although the insulating film 14 is illustrated as entirely surrounding the outer circumference of each of the first semiconductor layer 11, the active layer 12, and the second semiconductor layer 13, the disclosure is not limited thereto. In some embodiments, when the light emitting element LD includes the first contact electrode, the insulating film 14 may entirely surround the outer circumference of each of the first semiconductor layer 11, the active layer 12, the second semiconductor layer 13, and the first contact electrode. In other embodiments, the insulating film 14 may not entirely surround the outer circumference of the first contact electrode, or may surround only a portion of the outer circumference of the first contact electrode and may not surround the other portion of the outer circumference of the first contact electrode. In some embodiments, when the first contact electrode is disposed at an end portion (or upper end portion) of the light emitting element LD and the second contact electrode is disposed at another end portion (or the other end portion) of the light emitting element LD, the insulating film 14 may expose at least a portion of each of the first and second contact electrodes.

The insulating film 14 may include a transparent insulating material. For example, the insulating film 14 may include at least one insulating material selected from the group consisting of silicon oxide ($SiO_x$), silicon nitride ($SiN_x$), silicon oxynitride ($SiO_xN_y$), aluminum oxide ($AlO_x$), titanium dioxide ($TiO_2$), hafnium oxide ($HfO_x$), titanium strontium oxide ($SrTiO_x$), cobalt oxide ($Co_xO_y$), magnesium oxide (MgO), zinc oxide (ZnO), ruthenium oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, InxOy:H, niobium oxide ($Nb_xO_y$), magnesium fluoride ($MgF_x$), aluminum fluoride ($AlF_x$), Alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), vanadium nitride (VN), and the like. However, the disclosure is not limited thereto, and various materials having insulating properties may be used as the material of the insulating film 14.

The insulating film 14 may be provided in the form of a single layer or be provided in the form of a multi-layer including at least two layers. For example, when the insulating film 14 may be configured as a double layer including a first layer and a second layer, which are sequentially stacked, the first layer and the second layer may be made of different materials (or ingredients), and be formed through different processes. In some embodiments, the first layer and the second layers may be formed of the same material through a continuous process.

In some embodiments, the light emitting element LD may be implemented with a light emitting pattern having a core-shell structure. The first semiconductor layer 11 may be located at a core, i.e., in the middle (or center) of the light emitting element LD, the active layer 12 may be provided and/or formed in a shape surrounding the outer circumference of the first semiconductor layer 11, and the second semiconductor layer 13 may be provided and/or formed in a shape surrounding the active layer 12. Also, the light emitting element LD may further include a contact electrode (not shown) surrounding at least one side of the second semiconductor layer 13. In some embodiments, the light emitting element LD may further include an insulating film which is disposed on the outer circumference of the light emitting pattern having the core-shell structure and includes a transparent insulating material. The light emitting element LD implemented with the light emitting pattern having the core-shell structure may be fabricated through a growth process.

The above-described light emitting element LD may be used as a light emitting source (or light source) for various display devices. The light emitting element LD may be fabricated through a surface treatment process. For example, when light emitting elements LD are mixed in a liquid solution (or solvent) to be supplied to each pixel area (e.g., an emission area of each pixel or an emission area of each sub-pixel), each light emitting element LD may be surfacetreated such that the light emitting elements LD are not unequally condensed in the solution but equally dispersed in the solution.

A light emitting unit (or light emitting device) including the above-described light emitting element LD may be used in various types of devices that require a light source, including a display device. When light emitting elements LD are disposed in an emission area of each pixel of a display panel, the light emitting elements LD may be used as a light source of the pixel. However, the application field of the light emitting element LD is not limited to the above-described example. For example, the light emitting element LD may be used for other types of devices that require a light source, such as a lighting device.

Figure 4:
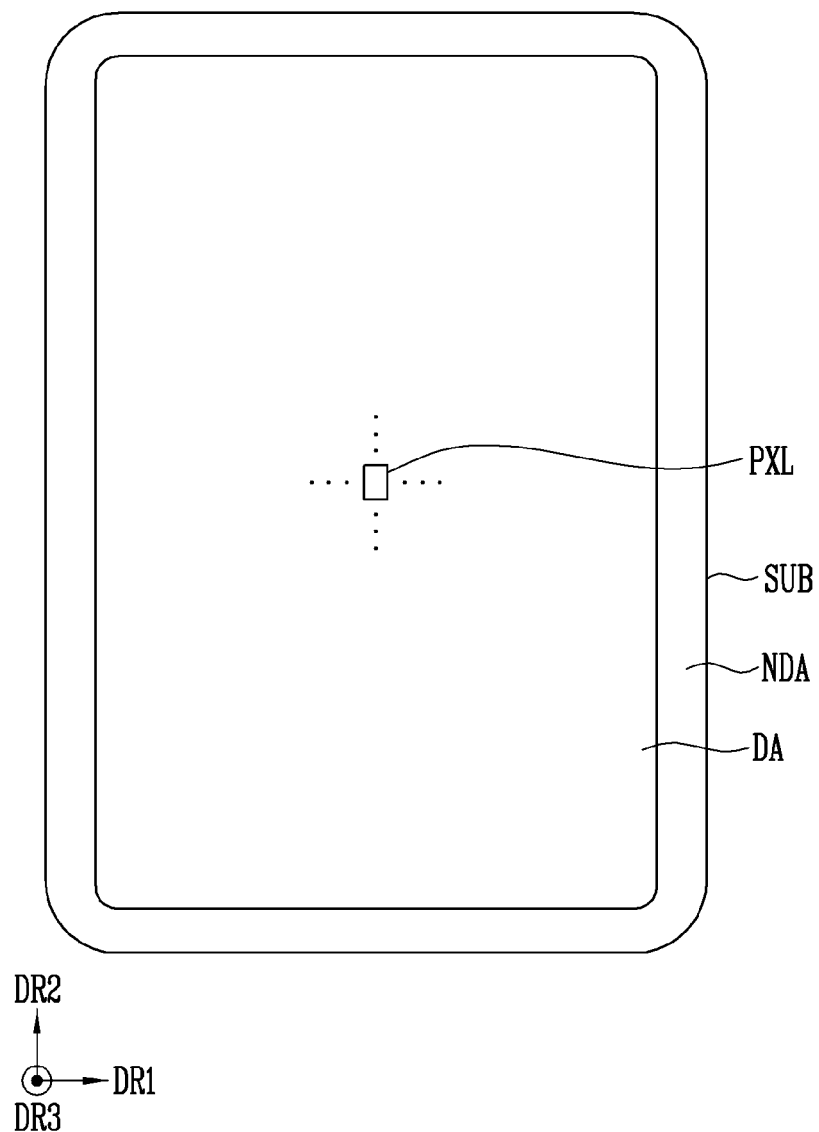
FIG. 4 is a plan view schematically illustrating a display device in accordance with an embodiment of the disclosure.

FIG. 4 is a plan view schematically illustrating a display device in accordance with an embodiment of the disclosure.

In FIG. 4, for convenience, the display device is briefly illustrated based on a display area DA in which an image is displayed.

The disclosure may be applied to any electronic device in which a display surface is applied to at least one surface thereof, such as a smartphone, a television, a tablet personal computer (PC), a mobile phone, a video phone, an electronic book reader, a desktop PC, a laptop PC, a netbook computer, a workstation, a server, a personal digital assistant (PDA), a portable multimedia player (PMP), an MP3 player, a medical device, a camera, or a wearable device.

Referring to FIGS. 1 to 4, the display device may include a substrate SUB, pixels PXL which are provided in the substrate SUB and which each includes at least one light emitting element LD, a driving unit which is provided in the substrate SUB and drives the pixels PXL, and a line unit which connects the pixels PXL and the driving unit.

The display device may be classified into a passive matrix type display device and an active matrix type display device according to a method of driving the light emitting element LD. For example, when the display device is implemented as the active matrix type display device, each of the pixels PXL may include a driving transistor for controlling an amount of current supplied to the light emitting element LD, a switching transistor for transferring a data signal to the driving transistor, and the like.

The display device may be provided in various shapes. For example, the display device may be provided in a rectangular plate shape having two pairs of sides parallel to each other, but the disclosure is not limited thereto. When the display device is provided in the rectangular plate shape, any one pair of sides among the two pairs of sides may be provided longer than the other pair of sides. For convenience, a case where the display device is provided in a rectangular shape having a pair of long sides and a pair of short sides is illustrated. An extending direction of the long sides is represented as a second direction DR2, an extending direction of the short sides is represented as a first direction DR1, and a direction perpendicular to the extending directions of the long sides and the short sides is represented as a third direction DR3. In the display device provided in the rectangular plate shape, a corner portion at which a long side and a short side contact (or meet) each other may have a round shape.

The substrate SUB may include the display area DA and a non-display area NDA.

The display area DA may be an area in which the pixels PXL for displaying an image are provided. The non-display area NDA may be an area in which the driving unit for driving the pixels PXL and a portion of the line unit which connects the pixels PXL and the driving unit are provided.

For convenience, only one pixel PXL is illustrated in FIG. 4, but multiple pixels PXL may be substantially provided in the display area DA of the substrate SUB.

The non-display area NDA may be provided on at least one side of the display area DA. The non-display area NDA may surround the circumference (or edge) of the display area DA. The non-display area NDA may be provided with the line unit electrically connected to the pixels PXL and the driving unit which is electrically connected to the line part and drives the pixels PXL.

The line unit may electrically connect the driving unit and the pixels PXL. The line unit may be a fan-out line which provides a signal to each pixel PXL and is electrically connected to signal lines, e.g., a scan line, a data line, an emission control line, and the like, which are connected to each pixel PXL. Also, the line unit may be a fan-out line electrically connected to signal lines, e.g., a control line, a sensing line, and the like, which are electrically connected to each pixel PXL, so as to compensate for an electrical characteristic change of each pixel PXL in real time.

The substrate SUB may include a transparent insulating material to enable light to be transmitted therethrough. The substrate SUB may be a rigid substrate or a flexible substrate.

One area on the substrate SUB may be provided as the display area DA such that the pixels PXL are disposed therein, and the other area on the substrate SUB may be provided as the non-display area NDA. For example, the substrate SUB may include the display area DA including pixel areas in which the respective pixels PXL are disposed, and the non-display area NDA disposed at the periphery of the display area DA (or adjacent to the display area DA).

Each of the pixels PXL may be provided in the display area DA on the substrate SUB. In an embodiment, the pixels PXL may be arranged in a stripe or PENTILE™ arrangement structure in the display area DA, but the disclosure is not limited thereto.

Each pixel PXL may include at least one light emitting element LD driven by a corresponding scan signal and a corresponding data signal. The light emitting element LD may have a small size, in the micrometer or nanometer range, and be connected in parallel to light emitting elements disposed adjacent thereto. However, the disclosure is not limited thereto. The light emitting element LD may constitute a light source of each pixel PXL.

Each pixel PXL may include at least one light source, e.g., the light emitting element LD shown in FIGS. 1 to 3, which is driven by a predetermined signal (e.g., a scan signal, a data signal, and the like) and/or a predetermined power source (e.g., a first driving power source, a second driving power source, and the like). However, in the embodiment of the disclosure, the kind of the light emitting element LD which may be used as the light source of the pixel PXL is not limited thereto.

The driving unit provides a predetermined signal and a predetermined power source to each pixel PXL through the line unit. Accordingly, the driving unit may control the driving of the pixel PXL.

Figure 5A:
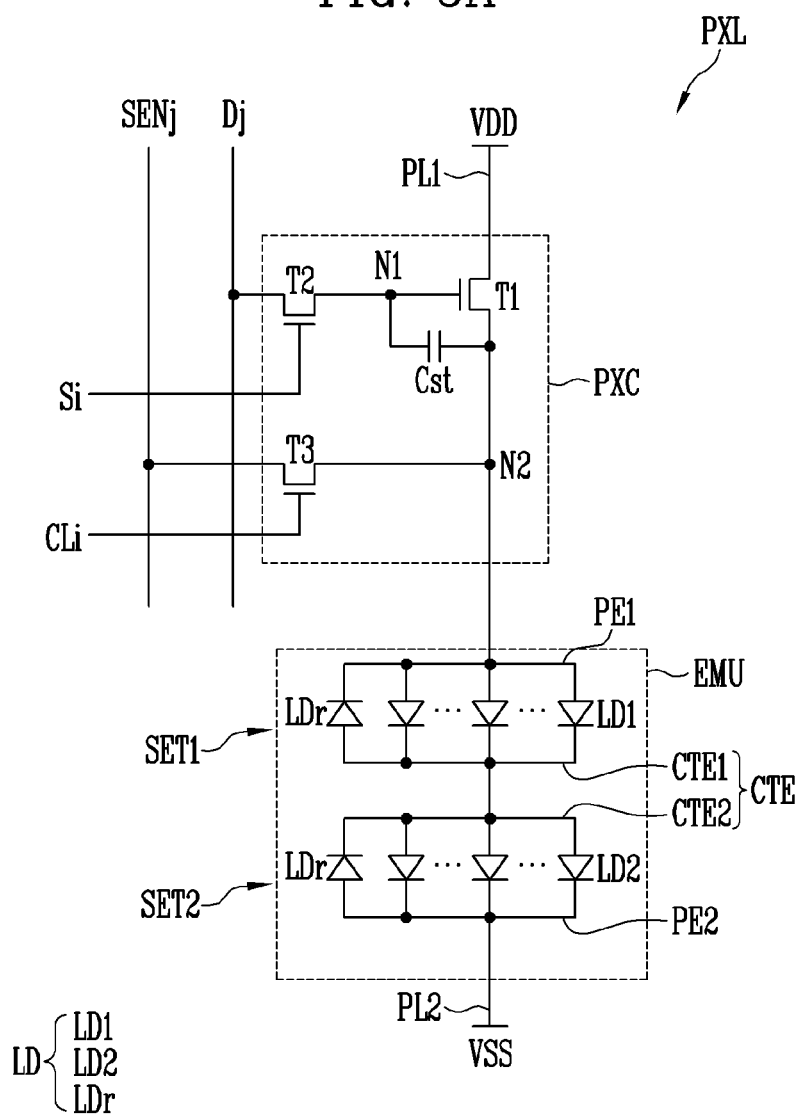
FIGS. 5A and 5B are circuit diagrams schematically illustrating various embodiments of an electrical connection relationship between components included in a pixel shown in FIG. 4.
Figure 5B:
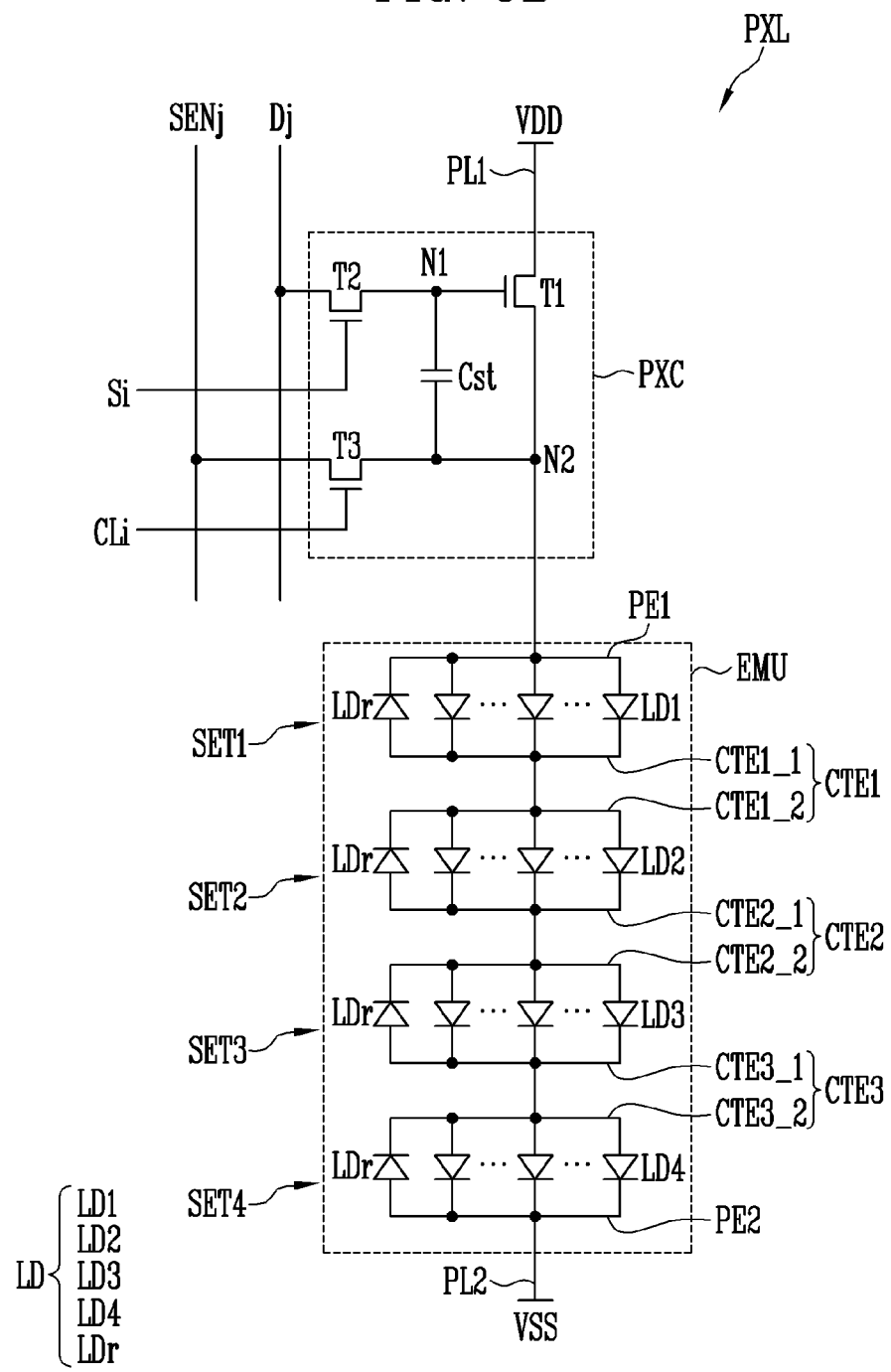

FIGS. 5A and 5B are circuit diagrams schematically illustrating various embodiments of an electrical connection relationship between components included in the pixel PXL shown in FIG. 4.

For example, FIGS. 5A and 5B illustrate various embodiments of an electrical connection relationship between components included in the pixel PXL applicable to an active matrix type display device. However, the kinds of the components included in the pixel PXL applicable to the embodiment of the disclosure are not limited thereto.

In FIGS. 5A and 5B, the pixel PXL comprehensively includes not only components included in the pixel PXL shown in FIG. 4 but also an area in which the components are provided.

Referring to FIGS. 1 to 5B, the pixel PXL may include a light emitting unit EMU which generates light with a luminance corresponding to a data signal. Also, the pixel PXL may selectively further include a pixel circuit PXC for driving the light emitting unit EMU.

In some embodiments, the light emitting unit EMU may include light emitting elements LD connected in parallel between a first power line PL1 electrically connected to a first driving power source VDD to be applied with a voltage of the first driving power source VDD and a second power line PL2 electrically connected to a second driving power source VSS to be applied with a voltage of the second driving power source VSS. For example, the light emitting unit EMU may include a first pixel electrode PE1 electrically connected to the first driving power source VDD via the pixel circuit PXC and the first power line PL1, a second pixel electrode PE2 electrically connected to the second driving power source VSS through the second power line PL2, and light emitting elements LD connected in parallel in the same direction between the first and second pixel electrodes PE1 and PE2. In an embodiment, the first pixel electrode PE1 may be an anode, and the second pixel electrode PE2 may be a cathode.

Each of the light emitting elements LD included in the light emitting unit EMU may include one end portion electrically connected to the first driving power source VDD through the first pixel electrode PE1 and the other end portion electrically connected to the second driving power source VSS through the second pixel electrode PE2. The first driving power source VDD and the second driving power source VSS may have different potentials. For example, the first driving power source VDD may be set as a high-potential power source, and the second driving power source VSS may be set as a low-potential power source. A potential difference between the first and second driving power sources VDD and VSS may be set equal to or higher than a threshold voltage of the light emitting elements LD during an emission period of the pixel PXL.

As described above, the light emitting elements LD connected in parallel in the same direction (e.g., a forward direction) between the first pixel electrode PE1 and the second pixel electrode PE2, to which voltages having difference potentials are supplied, may form effective light sources, respectively.

Each of the light emitting elements LD of the light emitting unit EMU may emit light with a luminance corresponding to a driving current supplied through a corresponding pixel circuit PXC. For example, the pixel circuit PXC may supply to the light emitting unit EMU, a driving current corresponding to a grayscale value of corresponding frame data during each frame period. The driving current supplied to the light emitting unit EMU may be divided to flow through each of the light emitting elements LD. Accordingly, the light emitting unit EMU may emit light with a luminance corresponding to the driving current while each light emitting element LD is emitting light with a luminance corresponding to a current flowing therethrough.

An embodiment in which both the end portions of the light emitting elements LD are connected in the same direction between the first and second driving power sources VDD and VSS has been described, but the disclosure is not limited thereto. In some embodiments, the light emitting unit EMU may further include at least one ineffective light source, e.g., a reverse light emitting element LDr, in addition to the light emitting elements LD forming the respective effective light sources. The reverse light emitting element LDr is connected in parallel together with the light emitting elements LD forming the effective light sources between the first and second pixel electrodes PE1 and PE2, and may be connected between the first and second pixel electrodes PE1 and PE2 in a direction opposite to that in which the light emitting elements LD are connected. Although a predetermined driving voltage (e.g., a forward driving voltage) is applied between the first and second pixel electrodes PE1 and PE2, the reverse light emitting element LDr maintains an inactivated state, and accordingly, no current substantially flows through the reverse light emitting element LDr.

The pixel circuit PXC may be electrically connected to a scan line Si and a data line Dj of the pixel PXL. Also, the pixel circuit PXC may be electrically connected to a control line CLi and a sensing line SENj of the pixel PXL. For example, when the pixel PXL may be disposed in an ith row and a jth column of the display area DA, the pixel circuit PXC of the pixel PXL may be electrically connected to an ith scan line Si, a jth data line Dj, an ith control line CLi, and a jth sensing line SENj of the display area DA.

The pixel circuit PXC may include first to third transistors T1 to T3 and a storage capacitor Cst.

The first transistor T1 is a driving transistor for controlling a driving current applied to the light emitting unit EMU, and may be electrically connected between the first driving power source VDD and the light emitting unit EMU. A first terminal of the first transistor T1 may be electrically connected (or coupled) to the first driving power source VDD through the first power line PL1, a second terminal of the first transistor T1 may be electrically connected to a second node N2, and a gate electrode of the first transistor T1 may be electrically connected to a first node N1. The first transistor T1 may control an amount of driving current applied to the light emitting unit EMU through the second node N2 from the first driving power source VDD according to a voltage applied to the first node N1. In an embodiment, the first terminal of the first transistor T1 may be a drain electrode, and the second terminal of the first transistor T1 may be a source electrode. However, the disclosure is not limited thereto. In some embodiments, the first terminal may be the source electrode, and the second terminal may be the drain electrode.

The second transistor T2 is a switching transistor which selects a pixel PXL in response to a scan signal and activates the pixel PXL, and may be electrically connected between the data line Dj and the first node N1. A first terminal of the second transistor T2 may be electrically connected to the data line Dj, a second terminal of the second transistor T2 may be electrically connected to the first node N1, and a gate electrode of the second transistor T2 may be electrically connected to the scan line Si. The first terminal and the second terminal of the second transistor T2 are different terminals. For example, when the first terminal is a drain electrode, the second terminal may be a source electrode.

The second transistor T2 may be turned on when a scan having a gate-on voltage (e.g., a high level voltage) is supplied from the scan line Si, to electrically connect the data line Dj and the first node N1 to each other. The first node N1 is a point at which the second terminal of the second transistor T2 and the gate electrode of the first transistor T1 are electrically connected to each other, and the second transistor T2 may transfer a data signal to the gate electrode of the first transistor T1.

The third transistor T3 connects the first transistor T1 to the sensing line SENj, to acquire a sensing signal through the sensing line SENj and to detect a characteristic of the pixel PXL, including a threshold voltage of the first transistor, or the like, by using the sensing signal. Information on the characteristic of the pixel PXL may be used to convert image data such that a characteristic deviation between pixels PXL may be compensated. A second terminal of the third transistor T3 may be electrically connected to the second terminal of the first transistor T1, a first terminal of the third transistor T3 may be electrically connected to the sensing line SENj, and a gate electrode of the third transistor T3 may be electrically connected to the control line CLi. Also, the first terminal of the third transistor T3 may be electrically connected to an initialization power source. The third transistor T3 is an initialization transistor capable of initializing the second node N2. The third transistor T3 may be turned on when a sensing control signal is supplied from the control line CLi, to transfer a voltage of the initialization power source to the second node N2. Accordingly, a second storage electrode of the storage capacitor Cst, which is electrically connected to the second node N2, may be initialized.

A first storage electrode of the storage capacitor Cst may be electrically connected to the first node N1, and the second storage electrode of the storage capacitor Cst may be electrically connected to the second node N2. The storage capacitor Cst charges a data voltage corresponding to the data signal supplied to the first node N1 during one frame period. Accordingly, the storage capacitor Cst may store a voltage corresponding to the difference between a voltage of the gate electrode of the first transistor T1 and a voltage of the second node N2.

The light emitting unit EMU may be configured to include at least one serial stage (or stage) including light emitting elements LD connected in parallel to each other. The light emitting unit EMU may be configured in a series/parallel hybrid structure as shown in FIGS. 5A and 5B.

Referring to FIG. 5A, the light emitting unit EMU may include first and second serial stages SET1 and SET2 sequentially connected between the first and second driving power sources VDD and VSS. Each of the first and second serial stages SET1 and SET2 may include two electrodes PE1 and CTE1 or CTE2 and PE2 constituting an electrode pair of the corresponding serial stage, and light emitting elements LD connected in parallel in the same direction between the two electrodes PE1 and CTE1 or CTE2 and PE2.

The first serial stage SET1 (or first stage) includes the first pixel electrode PE1 and a first intermediate electrode CTE1, and may include at least one first light emitting element LD1 electrically connected between the first pixel electrode PE1 and the first intermediate electrode CTE1. Also, the first serial stage SET1 may include a reverse light emitting element LDr connected in a direction opposite to that in which the first light emitting element LD1 is connected between the first pixel electrode PE1 and the first intermediate electrode CTE1.

The second serial stage SET (or second stage) includes a second intermediate electrode CTE2 and the second pixel electrode PE2, and may include at least one second light emitting element LD2 electrically connected between the second intermediate electrode CTE2 and the second pixel electrode PE2. Also, the second serial stage SET2 may include a reverse light emitting element LDr connected in a direction opposite to that in which the second light emitting element LD2 is connected between the second intermediate electrode CTE2 and the second pixel electrode PE2.

The first intermediate electrode CTE1 and the second intermediate electrode CTE2 may be electrically and/or physically connected to each other. The first intermediate electrode CTE1 and the second intermediate electrode CTE2 may constitute an intermediate electrode CTE which electrically connects the first serial stage SET1 and the second serial stage SET2, which are consecutive.

In the above-described embodiment, the first pixel electrode PE1 of the first serial stage SET1 may be an anode of each pixel PXL, and the second pixel electrode PE2 of the second serial stage SET2 may be a cathode of the corresponding pixel PXL.

As described above, the light emitting unit EMU of the pixel PXL, which includes the serial stages SET1 and SET2 (or the light emitting elements LD) connected in the series/parallel hybrid structure, may easily control driving current/voltage conditions to be suitable for specifications of a product to which the light emitting unit EMU is applied.

The light emitting unit EMU of the pixel PXL, which includes the serial stages SET1 and SET2 (or the light emitting elements LD) connected in the series/parallel hybrid structure, may decrease a driving current, as compared with a light emitting unit having a structure in which light emitting elements LD are connected only in parallel. The light emitting unit EMU of the pixel PXL, which includes the serial stages SET1 and SET2 connected in the series/parallel hybrid structure, may decrease a driving voltage applied to both ends of the light emitting unit EMU, as compared with a light emitting unit having a structure in which the same number of light emitting elements LD are connected only in series. Further, the light emitting unit EMU of the pixel PXL, which includes the serial stages SET1 and SET2 (or the light emitting elements LD) connected in the series/parallel hybrid structure, may include a larger number of light emitting elements LD between the same number of electrodes PE, CTE1, CTE2, and PE2, as compared with a light emitting unit having a structure in which serial stages (or stages) are all connected in series. Thus, the light emission efficiency of the light emitting element LD may be improved, and the ratio of light emitting elements LD which do not emit light due to a failure may be relatively decreased even when the failure occurs in a specific serial stage (or stage). Accordingly, the deterioration of the light emission efficiency of light emitting elements LD may be reduced.

Although the light emitting unit EMU including the first serial stage SET1 and the second serial stage SET2 has been described in the above-described embodiment, the disclosure is not limited thereto. In some embodiments, the light emitting unit EMU may be configured to include a first serial stage SET1, a second serial stage SET2, a third serial stage SET3, and a fourth serial stage SET4 as shown in FIG. 5B.

Referring to FIG. 5B, the light emitting unit EMU may include first to fourth serial stages SET1, SET2, SET3, and SET4 sequentially connected between the first and second driving power sources VDD and VSS. Each of the first to fourth serial stages SET1, SET2, SET3, and SET4 may include two electrodes PE1 and CTE1_1, CTE1_2 and CTE2_1, CTE2_2 and CTE3_1, or CTE3_2 and PE2 constituting an electrode pair of the corresponding serial stage, and light emitting elements LD connected in the same direction in parallel between the two electrodes PE1 and CTE1_1, CTE1_2 and CTE2_1, CTE2_2 and CTE3_1, or CTE3_2 and PE2.

The first serial stage SET1 (or first stage) includes the first pixel electrode PE1 and a (1-1)th intermediate electrode CTE1_1, and may include at least one first light emitting element LD1 connected between the first pixel electrode PE1 and the (1-1)th intermediate electrode CTE1_1. Also, the first serial stage SET1 may include a reverse light emitting element LDr connected in a direction opposite to that in which the first light emitting element LD1 is connected between the first pixel electrode PE1 and the (1-1)th intermediate electrode CTE1_1.

The second serial stage SET2 (or second stage) includes a (1-2)th intermediate electrode CTE1_2 and a (2-1)th intermediate electrode CTE2_1, and may include at least one second light emitting element LD2 connected between the (1-2)th intermediate electrode CTE1_2 and the (2-1)th intermediate electrode CTE2_1. Also, the second serial stage SET2 may include a reverse light emitting element LDr connected in a direction opposite to that in which the second light emitting element LD2 is connected between the (1-2)th intermediate electrode CTE1_2 and the (2-1)th intermediate electrode CTE2_1.

The (1-1)th intermediate electrode CTE1_1 and the (1-2)th intermediate electrode CTE1_2 may be electrically and/or physically connected to each other. The (1-1)th intermediate electrode CTE1_1 and the (1-2)th intermediate electrode CTE1_2 may constitute a first intermediate electrode CTE1 which electrically connects the first serial stage SET1 and the second serial stage SET2, which are consecutive.

The third serial stage SET3 (or third stage) includes a (2-2)th intermediate electrode CTE2_2 and a (3-1)th intermediate electrode CTE3_1, and may include at least one third light emitting element LD3 connected between the (2-2)th intermediate electrode CTE2_2 and the (3-1)th intermediate electrode CTE3_1. Also, the third serial stage SET3 may include a reverse light emitting element LDr connected in a direction opposite to that in which the third light emitting element LD3 is connected between the (2-2)th intermediate electrode CTE2_2 and the (3-1)th intermediate electrode CTE3_1.

The (2-1)th intermediate electrode CTE2_1 and the (2-2)th intermediate electrode CTE2_2 may be electrically and/or physically connected to each other. The (2-1)th intermediate electrode CTE2_1 and the (2-2)th intermediate electrode CTE2_2 may constitute a second intermediate electrode CTE2 which electrically connects the second serial state SET2 and the third serial stage SET3, which are consecutive.

The fourth serial stage SET4 (or fourth stage) includes a (3-2)th intermediate electrode CTE3_2 and the second pixel electrode PE2, and may include at least one fourth light emitting element LD4 connected between the (3-2)th intermediate electrode CTE3_2 and the second pixel electrode PE2. Also, the fourth serial stage SET4 may include a reverse light emitting element LDr connected in a direction opposite to that in which the fourth light emitting element LD4 is connected between the (3-2)th intermediate electrode CTE3_2 and the second pixel electrode PE2.

The (3-1)th intermediate electrode CTE3_1 and the (3-2)th intermediate electrode CTE3_2 may be electrically and/or physically connected to each other. The (3-1)th intermediate electrode CTE3_1 and the (3-2)th intermediate electrode CTE3_2 may constitute a third intermediate electrode CTE3 which electrically connects the third serial stage SET3 and the fourth serial stage SET4, which are consecutive.

In the above-described embodiment, the first pixel electrode PE1 of the first serial stage SET1 may be an anode of the light emitting unit EMU, and the second pixel electrode PE2 of the fourth serial stage SET4 may be a cathode of the light emitting unit EMU.

Although an embodiment in which all the first to third transistors T1, T2, and T3 included in the pixel circuit PXC are N-type transistors is illustrated in FIGS. 5A and 5B, the disclosure is not limited thereto. For example, at least one of the first to third transistors T1, T2, and T3 may be replaced with a P-type transistor. Also, although an embodiment in which the light emitting unit EMU is connected between the pixel circuit PXC and the second driving power source VSS is illustrated in FIGS. 5A and 5B, the light emitting unit EMU may be electrically connected between the first driving power source VDD and the pixel circuit PXC.

The structure of the pixel circuit PXC may be variously modified and embodied. For example, the pixel circuit PXC may include at least one transistor element such as a transistor element for initializing the first node N1 and/or a transistor element for controlling an emission time of the light emitting elements LD, or other circuit elements such as a boosting capacitor for boosting the voltage of the first node N1.

The structure of a pixel PXL applied to the disclosure is not limited to the embodiments shown in FIGS. 5A and 5B, and the corresponding pixel PXL may have various structures. For example, each pixel PXL may be configured in a passive light emitting display device, etc. The pixel circuit PXC may be omitted, and both end portions of the light emitting element LD included in the light emitting unit EMU may be directly connected to the scan line Si, the data line Dj, the first power line PL1 to which the first driving power source VDD is applied, the second power line PL2 to which the second driving power source VSS is applied, and/or a predetermined control line.

Figure 6:
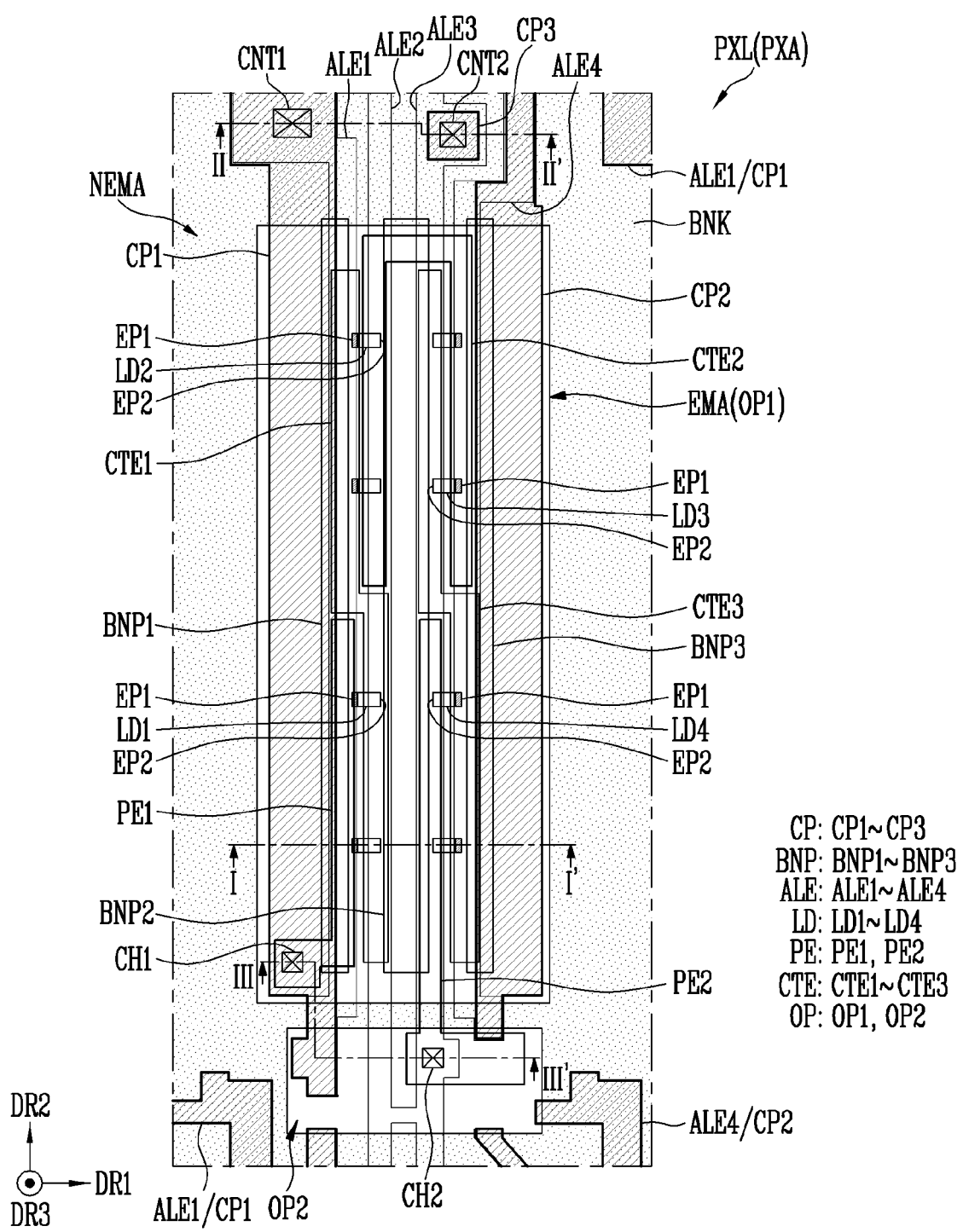
FIG. 6 is a plan view schematically illustrating the pixel shown in FIG. 4.
Figure 7:
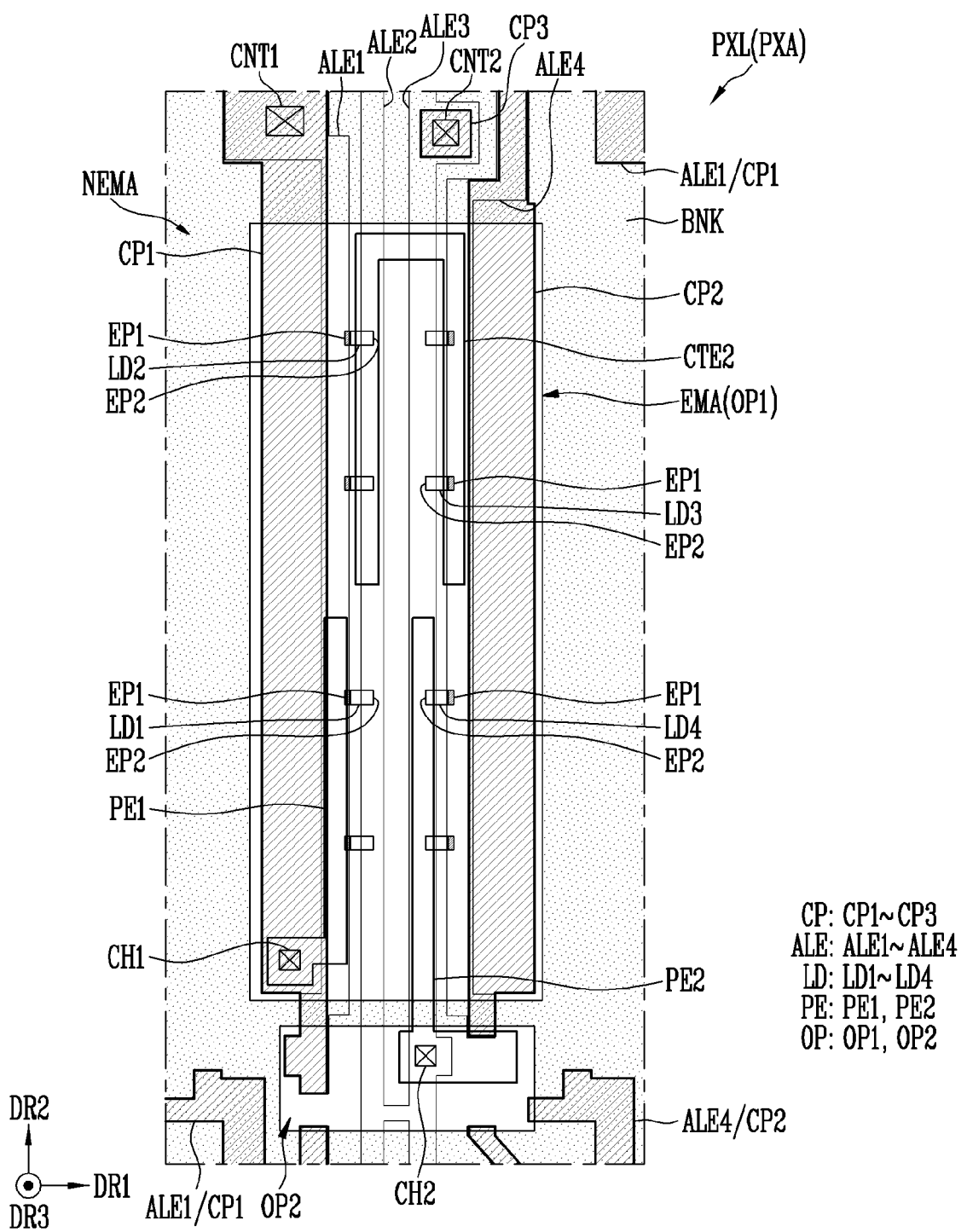
FIG. 7 is a plan view schematically illustrating only some components of the pixel shown in FIG. 6.

FIG. 6 is a plan view schematically illustrating the pixel PXL shown in FIG. 4. FIG. 7 is a plan view schematically illustrating only some components of the pixel shown in FIG. 6.

In FIG. 6, illustration of transistors electrically connected to light emitting elements LD and signal lines electrically connected to the transistors will be omitted for convenience.

In an embodiment of the disclosure, for convenience of description, a lateral direction (or horizontal direction) on a plane is represented as a first direction DR1, a longitudinal direction (or vertical direction) on a plane is represented as a second direction DR2, and a thickness direction of a substrate SUB on a section is represented as a third direction DR3. The first to third directions DR1, DR2, and DR3 may mean directions respectively indicated by the first to third directions DR1, DR2, and DR3.

In an embodiment of the disclosure, the term "connection" between two components may include both electrical and physical connections, but the disclosure is not necessarily limited thereto.

Referring to FIGS. 4 to 7, the pixel PXL may be located in a pixel area PXA provided in the substrate SUB. The pixel area PXA may include an emission area EMA and a non-emission area NEMA.

The pixel PXL may include a bank BNK located in the non-emission area NEMA.

The bank BNK is structure which defines (or partitions) a pixel area PXA (or emission area EMA) of each of the pixel PXL and adjacent pixels PXL adjacent thereto, and may be, for example, a pixel defining layer.

In an embodiment, the bank BNK may be a pixel defining layer or a dam structure, which defines each emission area EMA to which light emitting elements LD are to be supplied, in a process of supplying (or inputting) the light emitting elements LD to the pixel PXL. For example, the emission area EMA of the pixel PXL is partitioned by the bank BNK, so that a mixed liquid (e.g., ink) including a desired amount and/or a desired kind of light emitting elements LD may be supplied (or input) to the emission area EMA.

The bank BNK includes at least one light blocking material and/or at least one reflective material, to prevent a light leakage defect in which light (or beam) is leaked between the pixel PXL and pixels PXL adjacent thereto. In some embodiments, the bank BNK may include a transparent material (or substance). For example, the transparent material may include polyamides resin, polyimides resin, etc., but the disclosure is not limited thereto. In another embodiment, a reflective material layer may be separately provided and/or formed on the bank BNK so as to further improve the efficiency of light emitted from the pixel PXL.

The bank BNK may include at least one opening OP exposing components located thereunder in the pixel area PXA. For example, the bank BNK may include a first opening OP1 and a second OP2, which expose the components located under the bank BNK. In an embodiment, the emission area EMA of the pixel PXL and the first opening OP1 of the bank BNK may correspond to each other.

In the pixel area PXA, the second opening OP2 is located to be spaced apart from the first opening OP1, and may be located adjacent to one side, e.g., a lower side of the pixel area PXA. In an embodiment, the second opening OP2 may be an electrode separation area in which at least one alignment electrode ALE (or electrode) is separated from at least one alignment electrode ALE provided in pixels PXL adjacent in the second direction DR2.

The pixel PXL may include pixel electrodes PE and intermediate electrodes CTE, which are provided in at least the emission area EMA, light emitting elements LD electrically connected between the pixel electrode PE and the intermediate electrodes CTE, alignment electrodes ALE provided at positions corresponding to the pixel electrode PE and the intermediate electrodes CTE, bank patterns BNP (or patterns) disposed on the bottom of the alignment electrodes ALE such that each of the bank patterns BNP overlaps at least one alignment electrode ALE, and conductive patterns CP disposed on the bottom of the bank patterns BNP such that at least some of the conductive patterns CP overlap at least one bank pattern BNP. For example, the pixel PXL may include first and second pixel electrodes PE1 and PE2, first to third intermediate electrodes CTE1, CTE2, and CTE3, light emitting elements LD, first to fourth alignment electrodes ALE1, ALE2, ALE3, and ALE4, first to third bank patterns BNP1, BNP2, and BNP3, and first to third conductive patterns CP1, CP2, and CP3, which are provided in at least the emission area EMA. The pixel PXL may include at least one pair of pixel electrodes PE, at least one pair of intermediate electrodes CTE, at least one pair of alignment electrode ALE, at least one pair of bank patterns BNP, and/or at least one pair of conductive patterns CP. The number, shape, size, and arrangement structure of each of the pixel electrodes PE, the intermediate electrodes CTE, the alignment electrodes ALE, and/or the conductive patterns CP may be variously changed according to the structure of the pixel PXL (for example, the structure of the light emitting unit EMU).

In an embodiment, the conductive patterns CP, the bank patterns BNP, the alignment electrodes ALE, the light emitting elements LD, the pixel electrodes PE, and/or the intermediate electrodes CTE may be sequentially provided with respect to one surface of the substrate SUB on which the pixel PXL is provided, but the disclosure is not limited thereto. In some embodiments, the positions and formation order of electrode patterns and/or an insulating layer, constituting the pixel PXL, may be variously changed. A stacking structure of the pixel PXL will be described later with reference to FIGS. 8 to 12.

The conductive patterns CP may include the first conductive pattern CP1 and the second conductive pattern CP2, which are spaced apart from each other along the first direction DR1 in the emission area EMA, and each extends in the second direction DR2. Also, the conductive patterns CP may include the third conductive pattern CP3 located in at least the non-emission area NEMA.

The first conductive pattern CP1 and the second conductive pattern CP2 may be separated from first and second conductive patterns CP1 and CP2 of an adjacent pixel PXL, which are located in at least the emission area EMA, extend to the second opening OP2 of the bank BNK while passing through the non-emission area NEMA from the emission area EMA, and are adjacent in the second direction DR2 as portions of the first and second conductive patterns CP1 and CP2 are removed in the second opening OP2.

The first conductive pattern CP1 may partially overlap at least one alignment electrode ALE, e.g., the first alignment electrode ALE1 (or first electrode), and have a shape extending to be adjacent to the bank BNK in at least the emission area EMA. For example, the first conductive pattern CP1 may have a shape extending in at least the emission area EMA to be more adjacent to the non-emission area NEMA than the first alignment electrode ALE1.

The second conductive pattern CP2 may be located to be spaced apart from the first conductive pattern CP1, partially overlap at least one alignment electrode ALE, e.g., the fourth alignment electrode ALE4 (or fourth electrode), and have a shape extending to be adjacent to the bank BNK in at least the emission area EMA. For example, the second conductive pattern CP2 may have a shape extending in at least the emission area EMA to be more adjacent to the non-emission area NEMA than the fourth alignment electrode ALE4.

In a plan view, the first conductive pattern CP1 and the second conductive pattern CP2 may face each other with the second and third alignment electrodes ALE2 and ALE3 interposed therebetween.

The third conductive pattern CP3 may be located to be spaced apart from the first and second conductive patterns CP1 and CP2, and overlap one area of at least one alignment electrode ALE, e.g., the third alignment electrode ALE3 in at least the non-emission area NEMA.

The bank patterns BNP may be provided in at least the emission area EMA, be spaced apart from each other along the first direction DR1 in the emission area EMA, and each extend along the second direction DR2.

Each bank pattern BNP (also, referred to as a "wall pattern," "protrusion pattern," "supporting pattern," or "pattern") may have a uniform width in the emission area EMA. For example, in a plan view, each of the first, second, and third bank patterns BNP1, BNP2, and BNP3 may have a bar-like shape having a constant width along a direction in which the corresponding bank pattern extends in the emission area EMA.

The bank patterns BNP may have widths equal to or different from each other. For example, the first and third bank patterns BNP1 and BNP3 may have the same width in the first direction DR1 in at least the emission area EMA, and face each other with the second bank pattern BNP2 interposed therebetween. For example, the first and third bank patterns BNP1 and BNP3 may be formed symmetrical to each other with respect to the second bank pattern BNP2 in the emission area EMA.

The bank patterns BNP may be arranged at a uniform distance in the emission area EMA. For example, the first, second, and third bank patterns BNP1, BNP2, and BNP3 may be sequentially arranged at a constant distance along the first direction in the emission area EMA.

Each of the first and third bank patterns BNP1 and BNP3 may partially overlap at least one conductive pattern CP and at least one alignment electrode ALE in at least the emission area EMA. For example, the first bank pattern BNP1 may be provided between the first conductive pattern CP1 and the first alignment electrode ALE1 to overlap an area of the first conductive pattern CP1 and an area of the first alignment electrode ALE1, and the third bank pattern BNP3 may be provided between the second conductive pattern CP2 and the fourth alignment electrode ALE4 to overlap an area of the second conductive pattern CP2 and an area of the fourth alignment electrode ALE4.

The second bank pattern BNP2 may partially overlap the second and third alignment electrodes ALE2 and ALE3 in at least the emission area EMA. For example, the second bank pattern BNP2 may be disposed on the bottom of the second and third alignment electrodes ALE2 and ALE3 to overlap each of an area of the second alignment electrode ALE2 (or second electrode) and an area of the third alignment electrode ALE3 (or third electrode).

As the bank patterns BNP are disposed on the bottom of an area of each of the alignment electrodes ALE in the emission area EMA, one area of each of the alignment electrodes ALE may protrude in an upper direction of the pixel PXL in areas in which the bank patterns BNP are formed. Accordingly, a wall structure may be formed at the periphery of the light emitting elements LD. For example, the wall structure may be formed in the emission area EMA to face first and second end portions EP1 and EP2 of the light emitting elements LD.

In an embodiment, when the bank patterns BNP and/or the alignment electrodes ALE include a reflective material, a reflective wall structure may be formed at the periphery of the light emitting elements LD. Accordingly, light emitted from the light emitting elements LD is oriented in the upper direction of the pixel PXL (e.g., an image display direction of the display device), thereby further improving the light efficiency of the pixel PXL.

The alignment electrodes ALE may include the first alignment electrode ALE1 (or first alignment line), the second alignment electrode ALE2 (or second alignment line), the third alignment electrode ALE3 (or third alignment line), and the fourth alignment electrode ALE4 (or fourth alignment line), which are spaced apart from each other in the first direction DR1.

The first alignment electrode ALE1 may be located on the first bank pattern BNP1 and overlap the first bank pattern BNP1. Also, the first alignment electrode ALE1 may be located on the first conductive pattern CP1 in at least the non-emission area NEMA and partially overlap the first conductive pattern CP1. In an embodiment, the first alignment electrode ALE1 may be disposed directly on the first conductive pattern CP1 in at least the non-emission area NEMA to be electrically connected to the first conductive pattern CP1. The first alignment electrode ALE1 may have the same planar shape as the first conductive pattern CP1 in at least the non-emission area NEMA. The first alignment electrode ALE1 and the first conductive pattern CP1 may be separated from a first alignment electrode ALE1 and a first conductive pattern CP1, which are provided in adjacent pixels PXL adjacent to the pixel PXL in the second direction DR2 in the second opening OP2 (or electrode separation area).

The second alignment electrode ALE2 may be located on one side surface of the second bank pattern BNP2 and partially overlap the second bank pattern BNP2.

The third alignment electrode ALE3 may be located on the other side surface of the second bank pattern BNP2 and partially overlap the second bank pattern BNP2. The third alignment electrode ALE3 may be located on the third conductive pattern CP3 in at least the non-emission area NEMA and overlap the third conductive pattern CP3. In an embodiment, the third alignment electrode ALE3 may be disposed directly on the third conductive pattern CP3 in at least the non-emission area NEMA to be electrically connected to the third conductive pattern CP3.

The fourth alignment electrode ALE4 may be located on the third bank pattern BNP3 and overlap the third bank pattern BNP3. Also, the fourth alignment electrode ALE4 may be located on the second conductive pattern CP2 in at least the non-emission area NEMA and partially overlap the second conductive pattern CP2. In an embodiment, the fourth alignment electrode ALE4 may be disposed directly on the second conductive pattern CP2 in at least the non-emission area NEMA to be electrically connected to the second conductive pattern CP2. The fourth electrode ALE4 may have the same planar shape as the second conductive pattern CP2 in at least the non-emission area NEMA. The fourth alignment electrode ALE4 and the second conductive pattern CP2, which have the same planar shape in at least the non-emission area NEMA, may be separated from a fourth alignment electrode ALE4 and the second conductive pattern CP2, which are provided in adjacent pixels PXL adjacent to the pixel PXL in the second direction DR2 in the second opening OP2 (or electrode separation area).

Any of the conductive patterns CP and the alignment electrodes ALE may be electrically connected to a pixel circuit PXC of a corresponding pixel PXL and/or a predetermined power line through a contact part. For example, the first conductive pattern CP1 and the first alignment electrode ALE1 may be electrically connected to the pixel circuit PXC and/or the first power line PL1 through a first contact part CNT1, and the third conductive pattern CP3 and the third alignment electrode ALE3 may be electrically connected to the second power line PL2 through a second contact part CNT2.

In an embodiment, the first contact part CNT1 and the second contact part CNT2 may be located in the non-emission area NEMA to overlap the bank BNK. However, the disclosure is not limited thereto. In some embodiments, the first and second contact parts CNT1 and CNT2 may be located in the second opening OP2 as the electrode separation area.

A pair of alignment electrodes ALE adjacent to each other may be supplied with different signals in an alignment process of light emitting elements LD, and be spaced apart from each other at a uniform distance in the emission area EMA. When at least two pairs of alignment electrodes ALE are provided in the emission area EMA, each pair of alignment electrodes ALE may be spaced apart from each other at the same distance. For example, the first and second alignment electrodes ALE1 and ALE2 may form a pair to be supplied with different alignment signals, and the third and fourth alignment electrodes ALE3 and ALE4 may form a pair to be supplied with different alignment signals. In the emission area EMA, the first and second alignment electrodes ALE1 and ALE2 may be spaced apart from each other at a constant distance along the first direction DR1, and the third and fourth alignment electrodes ALE3 and ALE4 may also be spaced apart from each other at a constant distance along the first direction DR1.

The second and third alignment electrodes ALE2 and ALE3 may be supplied with the same signal in the alignment process of the light emitting elements LD. The second and third alignment electrodes ALE2 and ALE3 may be integrally connected to each other or be non-integrally connected to each other in the alignment process of the light emitting elements LD.

The above-described alignment signals may be signals having a voltage difference and/or a phase difference to a degree to which the light emitting elements LD may be aligned between the alignment electrodes ALE. At least one of the alignment signals may be an AC signal (or voltage), but the disclosure is not limited thereto.

Each alignment electrode ALE may have or may not have a bending part in the non-emission area NEMA and/or the second opening OP2 as the electrode separation area, and the shape and/or size of the alignment electrode ALE in the other area except the emission area EMA is not particularly limited and may be variously changed.

The first alignment electrode ALE1 may be electrically connected to each of a component of the pixel circuit PXC and the first pixel electrode PE1 through the first conductive pattern CP1. For example, the component of the pixel circuit PXC, of which one area is exposed by the first contact part CNT1, may be electrically connected to the first conductive pattern CP1 on the top of the first contact part CNT1 (for example, the first conductive pattern CP1 may overlap the first contact part CNT1) while being in direct contact with the first conductive pattern CP1. Accordingly, the first alignment electrode ALE1 disposed directly on one area of the first conductive pattern CP1 may be electrically connected to the component of the pixel circuit PXC. The first conductive patter CP1 of which another area is exposed through a first contact hole CH1 may be connected to the first pixel electrode PE1 located on the top of the first contact hole CH1 while being in direct contact with the first pixel electrode PE1. Accordingly, the first alignment electrode ALE1 may be electrically connected to the first pixel electrode PE1.

The third alignment electrode ALE3 may be connected to the second power line PL2 as another component of the pixel circuit PXC through the third conductive pattern CP3. The second power line PL2 of which one area is exposed by the second contact part CNT2 may be connected to the third conductive pattern CP3 located on the top of the second contact part CNT2 (for example, third first conductive pattern CP3 may overlap the first contact part CNT2) while being in direct contact with the third conductive pattern CP3. Accordingly, the third alignment electrode ALE3 disposed directly on the third conductive pattern CP3 may be electrically connected to the second power line PL2. The third alignment electrode AL3 may be connected to the second pixel electrode PE2 through a second contact hole CH2. The third alignment electrode ALE3 of which one area is exposed by the second contact hole CH2 may be connected to the second pixel electrode PE2 located on the top of the second contact hole CH2 while being in direct contact with the second pixel electrode PE2. As described above, the second power line PL2 and the second pixel electrode PE2 may be electrically connected to each other through the second contact part CNT2, at least one conductive pattern CP (e.g., the third conductive pattern CP3), and the third alignment electrode ALE3.

The second alignment electrode ALE2 may be integrally provided with the third alignment line ALE3 to be connected to the third alignment line ALE3.

The second contact hole CH2 may be located in the second opening OP2 as the electrode separation area. The second contact hole CH2 may be formed by removing a portion of at least one insulating layer which is located in the second opening OP2 and is located between the pixel electrode PE and the conductive patterns CP and/or the alignment electrodes ALE. For example, the second contact hole CH2 may be formed by removing a portion of at least one insulating layer which is located in the second opening OP2 and is located between third alignment electrode ALE3 and the second pixel electrode PE2.

The first contact hole CH1 may be located in the emission area EMA, but the disclosure is not limited thereto. In some embodiments, the first contact hole CH1 may be located in the second opening OP2.

At least two to a few tens of light emitting elements LD may be aligned and/or provided in the pixel area PXA, but the number of the light emitting elements LD is not limited thereto. In some embodiments, the number of light emitting elements LD aligned and/or provided in the emission area EMA (or the pixel area PXA) may be variously changed.

The light emitting elements LD may include a first light emitting element LD1, a second light emitting element LD2, a third light emitting element LD3, and a fourth light emitting element LD4.

The first light emitting element LD1 may be aligned between the first alignment electrode ALE1 and the second alignment electrode ALE2 to be electrically connected between the first pixel electrode PE1 and the first intermediate electrode CTE1, and the second light emitting element LD2 may be aligned between the first alignment electrode ALE1 and the second alignment electrode ALE2 to be electrically connected between the first intermediate electrode CTE1 and the second intermediate electrode CTE2. In a plan view, the first light emitting element LD1 may be aligned at a lower end in an area between the first alignment electrode ALE1 and the second alignment electrode ALE2, and the second light emitting element LD2 may be aligned at an upper end in the area.

In an embodiment, multiple first light emitting elements LD1 and multiple second light emitting element LD2 may be provided. A first end portion EP1 of each of the first light emitting elements LD1 may be connected to the first pixel electrode PE1, and a second end portion EP2 of each of the first light emitting elements LD1 may be connected to the first intermediate electrode CTE1. A first end portion EP1 of each of the second light emitting elements LD2 may be connected to the first intermediate electrode CTE1, and a second end portion EP2 of each of the second light emitting elements LD2 may be connected to the second intermediate electrode CTE2.

The third light emitting element LD3 may be aligned between the third alignment electrode ALE3 and the fourth alignment electrode ALE4 to be electrically connected between the second intermediate electrode CTE2 and the third intermediate electrode CTE3, and the fourth light emitting element LD4 may be aligned between the third alignment electrode ALE3 and the fourth alignment electrode ALE4 to be electrically connected between the third intermediate electrode CTE3 and the second pixel electrode PE2. In a plan view, the third light emitting elements LD3 may be aligned at an upper end in an area between the third alignment electrode ALE3 and the fourth alignment electrode ALE4, and the fourth light emitting element LD4 may be aligned at a lower end in the area.

In an embodiment, multiple third light emitting elements LD3 and multiple fourth light emitting element LD4 may be provided. A first end portion EP1 of each of the third light emitting elements LD3 may be connected to the second intermediate electrode CTE2, and a second end portion EP2 of each of the third light emitting elements LD3 may be connected to the third intermediate electrode CTE3. A first end portion EP1 of each of the fourth light emitting elements LD4 may be connected to the third intermediate electrode CTE3, and a second end portion of each of the fourth light emitting elements LD4 may be connected to the second pixel electrode PE2.

As described above, first light emitting elements LD1 may be located at a left lower end of the emission area EMA, second light emitting elements LD2 may be located at a left upper end of the emission area EMA, third light emitting elements LD3 may be located at a right upper end of the emission area EMA, and fourth light emitting elements LD4 may be located at a right lower end of the emission area EMA. However, the arrangement and/or connection structure of the light emitting elements LD is not limited to the above-described embodiment. In some embodiments, the arrangement and/or connection structure of the light emitting elements LD may be variously changed according to the number of components and/or serial stages (or stages), which are included in the light emitting unit EMU.

The first light emitting elements LD1 may be connected in parallel to each other between the first pixel electrode PE1 and the first intermediate electrode CTE1, and constitute a first serial stage SET1. Second light emitting elements LD2 may be connected in parallel to each other between the first intermediate electrode CTE1 and the second intermediate electrode CTE2, and constitute a second serial stage SET2. Third light emitting elements LD3 may be connected in parallel to each other between the second intermediate electrode CTE2 and the third intermediate electrode CTE3, and constitute a third serial stage SET3. Fourth light emitting elements LD4 may be connected in parallel to each other between the third intermediate electrode CTE3 and the second pixel electrode PE2, and constitute a fourth serial stage SET4.

In some embodiments, each of the first light emitting element LD, the second light emitting element LD2, the third light emitting element LD3, and the fourth light emitting element LD4 may be a light emitting diode having a subminiature size, e.g., a size small in the nanometer to micrometer range, which is fabricated by using a material having an inorganic crystalline structure. For example, each of the first light emitting element LD, the second light emitting element LD2, the third light emitting element LD3, and the fourth light emitting element LD4 may be a light emitting element LD described with reference to FIGS. 1 to 3.

The pixel electrodes PE and the intermediate electrodes CTE may be provided in at least the emission area EMA, and be respectively provided at positions corresponding to at least one alignment electrode ALE and at least one light emitting element LD. For example, each pixel electrode PE and each intermediate electrode CTE may be formed on each alignment electrode ALE and corresponding light emitting elements LD to overlap the alignment electrode ALE and the corresponding light emitting elements LD. Therefore, the pixel electrode PE and the intermediate electrode CTE may be electrically connected to at least the light emitting elements LD.

The first pixel electrode PE1 may be formed on one area (e.g., a lower end area) of the first alignment electrode ALE1 and the first end portion EP1 of each of the first light emitting elements LD1, to be electrically connected to the first end portion EP1 of each of the first light emitting elements LD1.

The second pixel electrode PE2 may be formed on one area (e.g., a lower end area) of the third alignment electrode ALE3 and the second end portion EP2 of each of the fourth light emitting elements LD4, to be electrically connected to the second end portion EP2 of each of the fourth light emitting elements LD4. Also, the second pixel electrode PE2 may be electrically connected to the first, second, and third light emitting elements LD1, LD2, and LD3 via at least one intermediate electrode CTE and/or light emitting elements LD. For example, the second pixel electrode PE2 may be electrically connected to the second end portion EP2 of each first light emitting element LD1 via the first intermediate electrode CTE1, the second light emitting element LD2, the second intermediate electrode CTE2, the third light emitting element LD3, the third intermediate electrode CTE3, and the fourth light emitting element LD4.

The first intermediate electrode CTE1 may be formed on an area (e.g., a lower end area) of the second alignment electrode ALE2 and the second end portion EP2 of each of the first light emitting elements LD1 to be electrically connected to the second end portion EP2 of each of the first light emitting elements LD1. Also, the first intermediate electrode CTE1 may be formed on another area (e.g., an upper end area) of the first alignment electrode ALE1 and the first end portion EP1 of each of the second light emitting element LD2 to be electrically connected to the first end portion EP1 of each of the second light emitting elements LD2. The above-described first intermediate electrode CTE1 may be a first bridge electrode which connects the first serial stage SET1 (or the first light emitting elements LD1) and the second serial stage SET2 (or the second light emitting elements LD2) to each other.

The first intermediate electrode CTE1 may have a shape bent at least once. For example, the first intermediate electrode CTE1 may have a shape bent, warped, or curved at least once between an area in which at least one first light emitting element LD1 is arranged and an area in which at least one second light emitting element LD2 is arranged (e.g., at a boundary between the areas), but the disclosure is not limited thereto. In some embodiments, the first intermediate electrode CTE1 may be modified in various shapes within a range in which the first serial stage SET1 and the second serial stage SET2, which are consecutive, are stably connected to each other.

The first intermediate electrode CTE1 may be located between the first pixel electrode PE1 and the second pixel electrode PE2, and be electrically connected between the first pixel electrode PE1 and the second pixel electrode PE2 through light emitting elements LD. For example, the first intermediate electrode CTE1 may be connected to the first pixel electrode PE1 through at least one first light emitting element LD1, and be connected to the second pixel electrode PE2 through at least one second light emitting element LD2, at least one third light emitting element LD3, and/or at least one fourth light emitting element LD4.

The second intermediate electrode CTE2 may be formed on another area (e.g., an upper area) of the second alignment electrode ALE2 and the second end portion EP2 of each of the light emitting elements LD2 to be electrically connected to the second end portion EP2 of each of the second light emitting elements LD2. Also, the second intermediate electrode CTE2 may be formed on one area (e.g., an upper end area) of the fourth alignment electrode Ale4 and the first end portion EP1 of each of the third light emitting element LD3 to be electrically connected to the first end portion EP1 of each of the third light emitting element LD3. For example, the second intermediate electrode CTE2 may be connected to the second end portion EP2 of each of the second light emitting elements LD2 and the first end portion of each of the third light emitting elements LD3 in the emission area EMA. The above-described second intermediate electrode CTE2 may be a second bridge which connects the second serial stage SET2 (or the second light emitting elements LD2) and the third serial stage SET3 (or the third light emitting elements) to each other.

The second intermediate electrode CTE2 may have a shape bent at least once. For example, the second intermediate electrode CTE2 may have a shape bent, warped, or curved at a boundary between an area in which at least one second light emitting element LD2 is arranged and an area in which at least one third light emitting element LD3 is arranged (or between the areas) or at the periphery thereof, but the disclosure is not limited thereto. In some embodiments, the second intermediate electrode CTE2 may be modified in various shapes within a range in which the second serial stage SET2 and the third serial stage SET3, which are consecutive, are stably connected to each other. In an embodiment, the second intermediate electrode CTE2 does not extend to the second opening OP2 as the electrode separation area but may be located only in the emission area EMA. However, the disclosure is not limited thereto.

Also, the second intermediate electrode CTE2 may be electrically connected between the first and second pixel electrodes PE1 and PE2 through light emitting elements LD. For example, the second intermediate electrode CTE2 may be connected to the first pixel electrode PE1 through at least one first light emitting element LD1 and/or at least one second light emitting element LD2, and be connected to the second pixel electrode PE2 through at least one third light emitting element LD3 and/or at least one fourth light emitting element LD4.

The third intermediate electrode CTE3 may be formed on another area (e.g., an upper end area) of the third alignment electrode ALE3 and the second end portion EP2 of each of the third light emitting elements LD3 to be electrically connected to the second end portion EP2 of each of the third light emitting elements LD3. Also, the third intermediate electrode CTE3 may be formed on another area (e.g., a lower end area) of the fourth alignment electrode ALE4 and the first end portion EP1 of each of the fourth light emitting elements LD4 to be electrically connected to the first end portion EP1 of each of the fourth light emitting elements LD4. For example, the third intermediate electrode CTE3 may be connected to the second end portion EP2 of each of the third light emitting elements LD3 and the first end portion EP1 of each of the fourth light emitting elements LD4 in the emission area EMA. The above-described third intermediate electrode CTE3 may be a third bridge electrode which connects the third serial stage SET3 (or the third light emitting elements LD3) and the fourth serial stage SET4 (or the fourth light emitting elements LD4) to each other.

The third intermediate electrode CTE3 may have a shape bent at least once. For example, the third intermediate electrode CTE3 may have a shape bent, warped, or curved between an area in which at least one third light emitting element LD3 is arranged and an area in which at least one fourth light emitting element LD4 is arranged (or at a boundary between the areas), but the disclosure is not limited thereto. In some embodiments, the third intermediate electrode CTE3 may be modified in various shapes within a range in which the third serial stage SET3 and the fourth serial stage SET4, which are consecutive, are stably connected to each other.

Also, the third intermediate electrode CTE3 may be electrically connected between the first pixel electrode PE1 and the second pixel electrode PE2 through light emitting elements LD. For example, the third intermediate electrode CTE3 may be connected to the first pixel electrode PE1 through at least one first light emitting element LD1, at least one second light emitting element LD2, and/or at least one third light emitting element LD3, and be connected to the second pixel electrode PE2 through at least one fourth light emitting element LD4.

As described above, the first light emitting element LD1 may be connected in series to the second light emitting element LD2 through the first intermediate electrode CTE1, the second light emitting element LD2 may be connected in series to the third light emitting element Ld3 through the second intermediate electrode CTE2, and the third light emitting element LD3 may be connected in series to the fourth light emitting element LD4 through the third intermediate electrode CTE3.

In the pixel PXL, a driving current may flow from the first pixel electrode PE1 to the second pixel electrode PE2 via the first light emitting element LD1, the first intermediate electrode CTE1, the second light emitting element LD2, the second intermediate electrode CTE2, the third light emitting element LD3, the third intermediate electrode CTE3, and the fourth light emitting element LD4 during each frame period.

The first light emitting element LD1, the second light emitting element LD2, the third light emitting element LD3, and the fourth light emitting element LD4 may be connected in series to each other through the first intermediate electrode CTE1, the second intermediate electrode CTE2, and the third intermediate electrode CTE3 between the first pixel electrode PE1 and the second pixel electrode PE2. In this manner, light emitting elements LD aligned in the emission area EMA are connected in a series/parallel hybrid structure, to constitute the light emitting unit EMU of the pixel PXL. Accordingly, the light emitting unit EMU may be configured in a series/parallel hybrid structure including four serial stages SET1, SET2, SET3, and SET4 while minimizing the area occupied by alignment electrodes ALE (or not increasing the number of alignment electrodes ALE). Accordingly, a display device having high resolution and high definition may be easily implemented.

In an embodiment of the disclosure, each of the first conductive pattern CP1 and the second conductive pattern CP2 may be provided in a shape extending to be adjacent to the bank BNK located in the non-emission area NEMA. For example, the first and second conductive patterns CP1 and CP2 may be provided in a shape extending to sufficiently cover components included in the pixel circuit PXC. The first and second conductive patterns CP1 and CP2 may be used as a shielding member which blocks an electric field introduced from transistors constituting the pixel circuit PXC, e.g., first to third transistors T1 to T3 and signal lines connected to the first to third transistors T1 to T3.

When the first conductive pattern CP1 and the first alignment electrode ALE1 are electrically connected to each other as the first alignment electrode ALE1 is disposed directly on the first conductive pattern CP1, an alignment signal applied to the first alignment electrode ALE1 may be applied to the first conductive pattern CP1 in a process of aligning the light emitting elements LD in the emission area EMA. The same alignment signal may be applied to the first conductive pattern CP1 and the first alignment electrode ALE1. As described above, the first conductive pattern CP1 to which a predetermined signal is applied is provided in a shape extending to be interposed between the pixel circuit PXC and the first alignment electrode ALE1 and to sufficiently cover the components included in the pixel circuit PXC, so that parasitic capacitance between the first alignment electrode ALE1 and the pixel circuit PXC may be shielded.

When the second conductive pattern CP2 and the fourth alignment electrode ALE4 are electrically connected to each other as the fourth alignment electrode ALE4 is disposed directly on the second conductive pattern CP2, an alignment signal applied to the fourth alignment electrode ALE4 may be applied to the second conductive pattern CP2 in the process of aligning the light emitting elements LD in the emission area EMA. The same alignment signal may be applied to the second conductive pattern CP2 and the fourth alignment electrode ALE4. As described above, the second conductive pattern CP2 to which a predetermined signal is applied is provided in a shape extending to be interposed between the pixel circuit PXC and the fourth alignment electrode ALE4 and to sufficiently cover the components included in the pixel circuit PXC, so that parasitic capacitance between the fourth alignment electrode ALE4 and the pixel circuit PXC may be shielded.

When an electric field is formed each of between the first and second alignment electrodes ALE1 and ALE2 and between the third and fourth alignment electrodes ALE3 and ALE4 by applying an alignment signal corresponding to the first to fourth alignment electrodes ALE1 to ALE4 to align light emitting elements LD, the first and second conductive patterns CP1 and CP2 block electric fields that may influence the alignment of the light emitting elements LD from being introduced by the pixel circuit PXC and signal lines connected thereto. The light emitting elements LD may be more stably aligned without being dislocated from a desired area (between the alignment electrodes). Accordingly, the separation of the light emitting elements LD is reduced, so that effective light sources of each pixel may be further secured, thereby improving the light emission efficiency of the light emitting elements LD.

As described above, when the first and second conductive patterns CP1 and CP2 are used as shielding members, the alignment and/or driving of light emitting elements LD, influence by the electric fields, induced from the pixel circuit PXC and the signal lines connected thereto, may be reduced or minimized, and accordingly, the misalignment and/or malfunction of the light emitting elements LD may be prevented.

In accordance with the above-described embodiment, when the first conductive pattern CP1 and the first pixel electrode PE1 are connected to each other while contacting each other through the first contact hole CH1, the first alignment electrode ALE1 having a relatively high resistance and the first pixel electrode PE1 are not in direct contact with each other due to a material characteristic and/or oxidation occurring in a fabrication process, and hence contact resistance of the first pixel electrode PE1 may not increase.

Hereinafter, a stacking structure of the pixel PXL in accordance with the above-described embodiment will be mainly described with reference to FIGS. 8 to 12.

Figure 8:
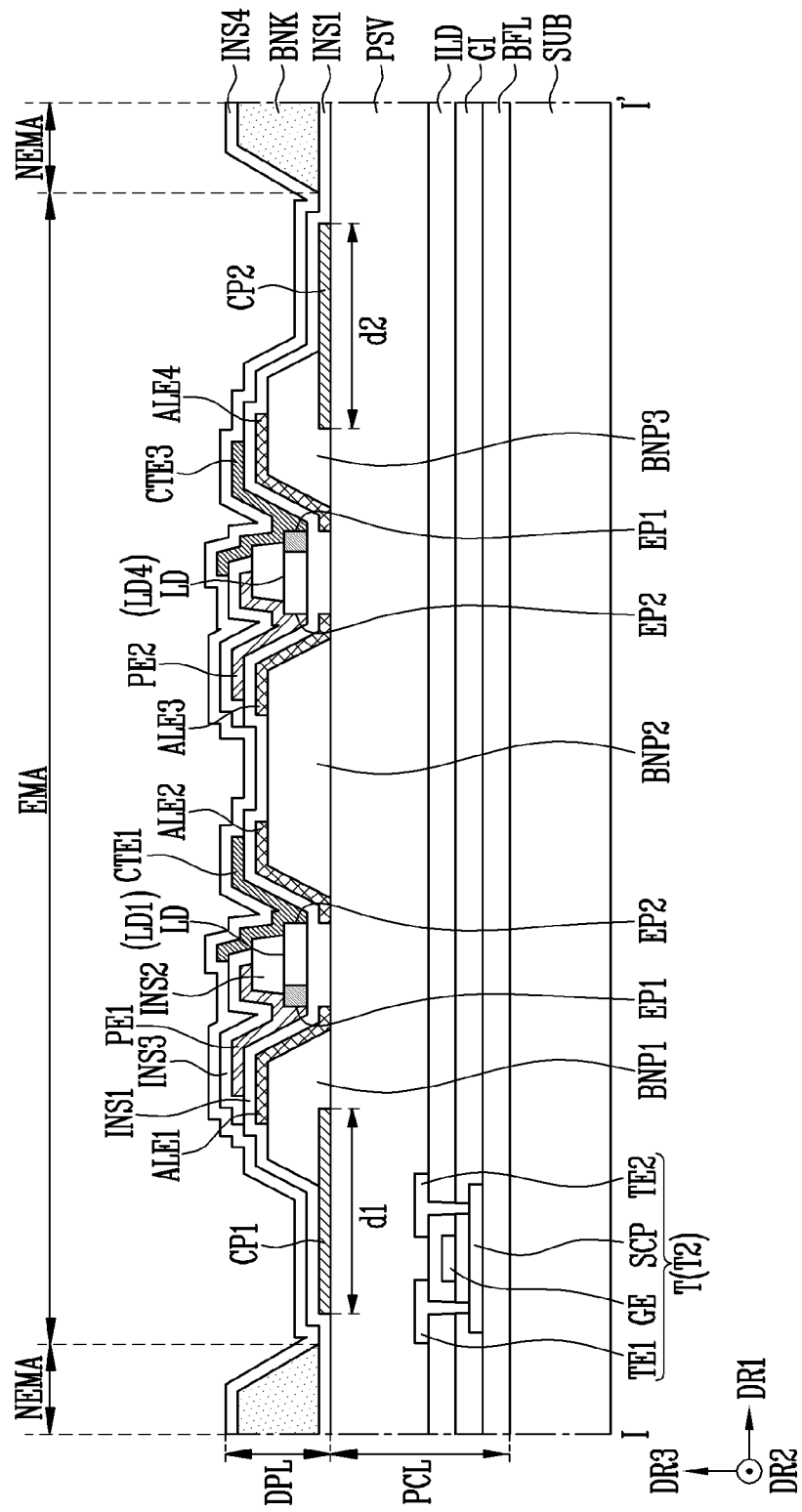
FIGS. 8 to 10 are schematic cross-sectional views taken along line I-I' shown in FIG. 6.
Figure 9:
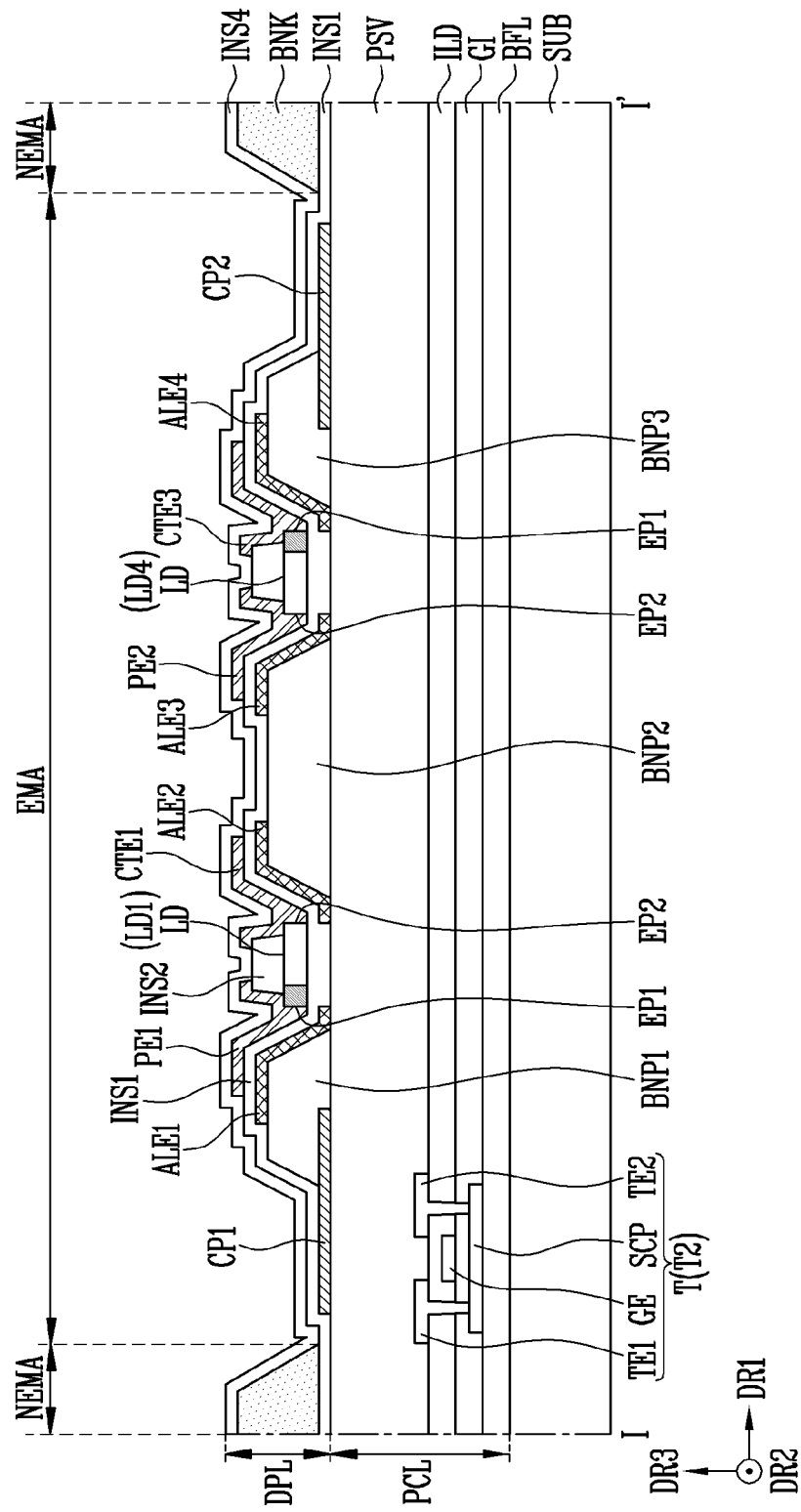
Figure 10:
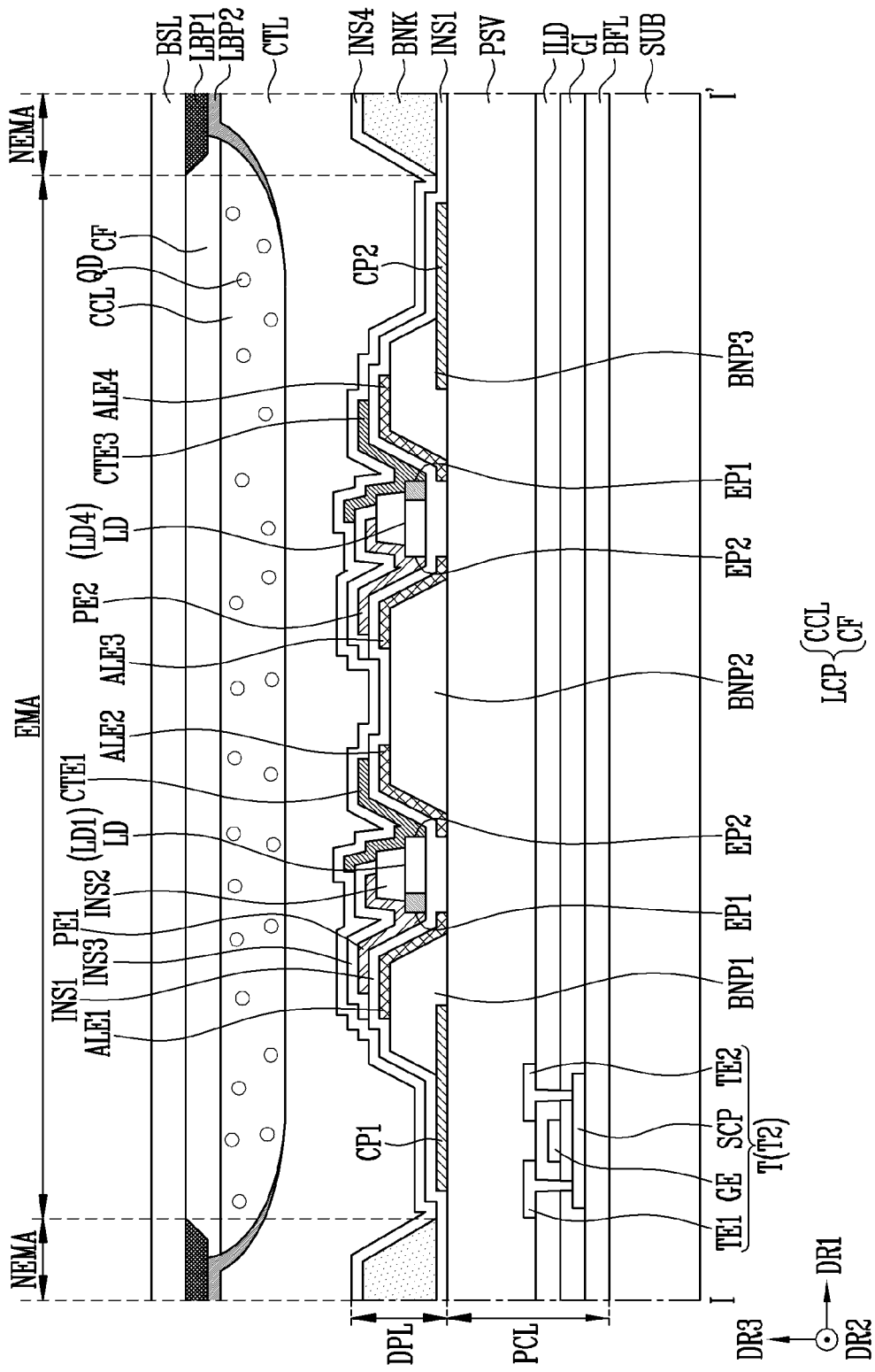
Figure 11:
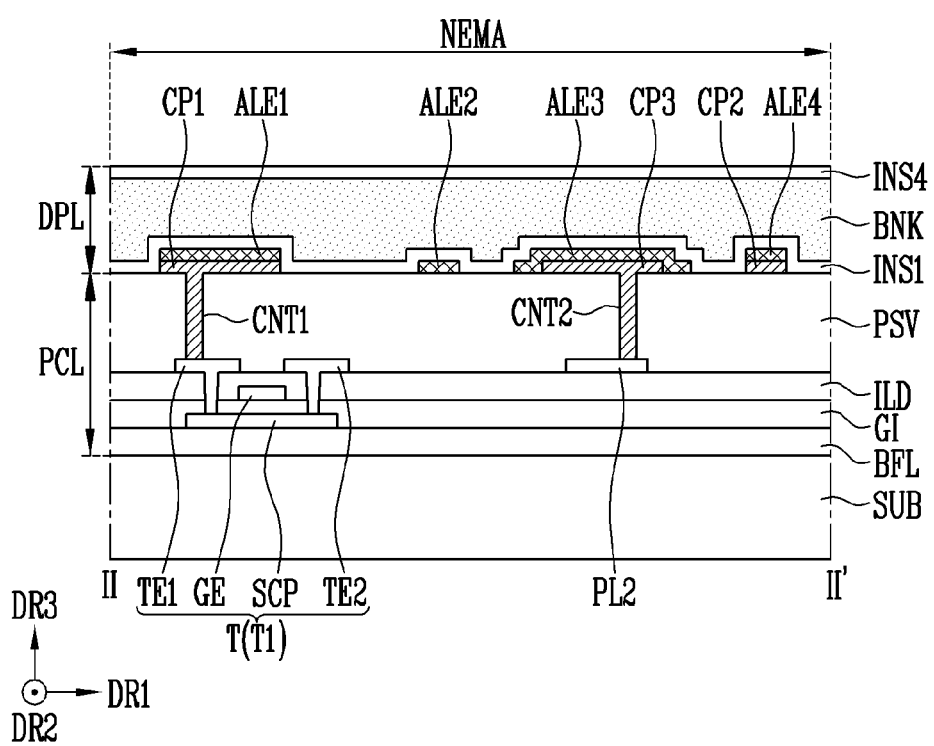
FIG. 11 is a schematic cross-sectional view taken along line II-IF shown in FIG. 6.
Figure 12:
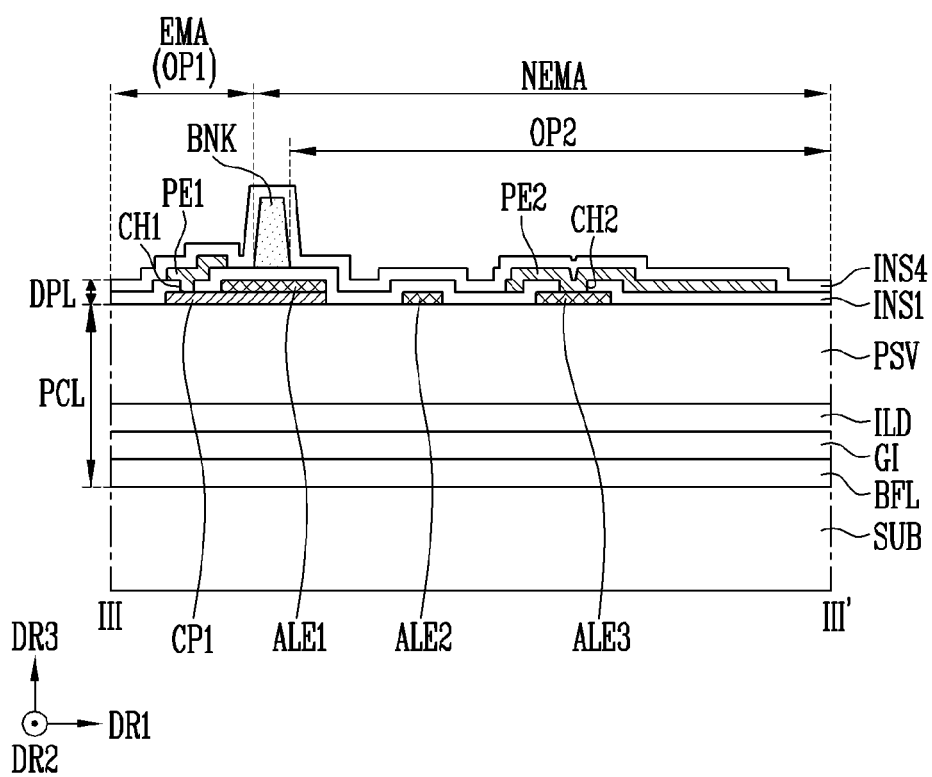
FIG. 12 is a schematic cross-sectional view taken along line shown in FIG. 6.

FIGS. 8 to 10 are cross-sectional views taken along line I-I' shown in FIG. 6. FIG. 11 is a cross-sectional view taken along line II-II' shown in FIG. 6. FIG. 12 is a cross-sectional view taken along line III-III' shown in FIG. 6.

In an embodiment of the disclosure, the term "being formed and/or provided in the same layer" may mean being formed in the same process, and the term "being formed and/or provided in different layers" may mean being formed in different processes.

Embodiments shown in FIGS. 8 and 9 represent different embodiments in relation to a process of forming a pixel electrode PE and an intermediate electrode CTE and whether a third insulating layer INS3 exists. For example, an embodiment in which intermediate electrodes CTE are formed after pixel electrodes PE and the third insulating layer INS3 are formed is illustrated in FIG. 8, and an embodiment in which the pixel electrodes PE and the intermediate electrodes CTE are formed in the same layer is illustrated in FIG. 9. FIG. 10 illustrates a modification of the embodiment shown in FIG. 8 in relation to an optical pattern LCP, etc.

In FIGS. 8 to 12, a pixel PXL is simplified and schematically illustrated, such as that each electrode is illustrated as an electrode having a single layer (or single film) and each insulating layer is illustrated as an insulating layer provided as a single layer (or single film), but the disclosure is not limited thereto.

Also, in FIGS. 8 to 12, a lateral direction (or horizontal direction) on a section is represented as a first direction DR1, a longitudinal direction (or vertical direction) on a plane is represented as a second direction DR2, and a thickness direction of a substrate SUB on a section is represented as a third direction DR3. The first to third directions DR1, DR2, and DR3 may mean directions respectively indicated by the first to third directions DR1, DR2, and DR3.

Referring to FIGS. 4 to 12, the pixel PXL may include the substrate SUB, a pixel circuit layer PCL, and a display element layer DPL. The pixel circuit layer PCL and the display element layer DPL may be disposed on a surface of the substrate SUB to overlap each other. For example, the display area DA of the substrate SUB may include the pixel circuit layer PCL disposed on the one surface of the substrate SUB and the display element layer DPL disposed on the pixel circuit layer PCL. However, mutual positions of the pixel circuit layer PCL and the display element layer DPL on the substrate SUB may be changed in some embodiments. When the pixel circuit layer PCL and the display element layer DPL overlap each other in layers separate from each other, each layout space for forming the pixel circuit PXC and the light emitting unit EMU may be sufficiently secured on a plane.

The substrate SUB may include a transparent insulating material to enable light to be transmitted therethrough. The substrate SUB may be a rigid substrate or a flexible substrate.

The rigid substrate may be, for example, one of a glass substrate, a quartz substrate, a glass ceramic substrate, and a crystalline glass substrate.

The flexible substrate may be one of a film substrate and a plastic substrate, which include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

Circuit elements (e.g., transistors T and a storage capacitor Cst) constituting a pixel circuit PXC of a corresponding pixel PXL and signal lines electrically connected to the circuit elements may be disposed in each pixel area PXA of the pixel circuit layer PCL. A conductive pattern CP, an alignment electrode ALE, light emitting elements LD, and/or pixel electrodes PE, which constitute a light emitting unit EMU of a corresponding pixel PXL, may be disposed in each pixel area PXA of the display element layer DPL.

The pixel circuit layer PCL may include at least one insulating layer in addition to the circuit elements and the signal lines. For example, the pixel circuit layer PCL may include a buffer layer BFL, a gate insulating layer GI, an interlayer insulating layer ILD, and a passivation layer PSV, which are sequentially stacked along the third direction DR3.

The buffer layer BFL may prevent an impurity from being diffused into a transistor T included in the pixel circuit PXC. The buffer layer BFL may be an inorganic insulating layer including an inorganic material. The buffer layer BFL may include, for example, at least one of silicon nitride ($SiN_x$), silicon oxide ($SiO_x$), silicon oxynitride ($SiO_xN_y$), and metal oxide such as aluminum oxide ($AlO_x$). The buffer layer BFL may be provided in a single layer, but be provided in a multi-layer including at least two layers. When the buffer layer BFL is provided in multiple layers, the layers may include the same material or include different materials. The buffer layer BFL may be omitted according to the material and process conditions of the substrate SUB.

The pixel circuit PXC may include a first transistor T1 (or driving transistor) and a second transistor T2 (or switching transistor) electrically connected to the first transistor T1. However, the disclosure is not limited thereto, and the pixel circuit PXC may further include circuit elements for performing other functions in addition to the first transistor T1 and the second transistor T1. In the following embodiment, when the first transistor T1 and the second transistor T2 are inclusively designated, each of the first transistor T1 and the second transistor T2 or both the first transistor T1 and the second transistor T2 are referred to as a transistor T or transistors T.

Each of the transistors T may include a semiconductor pattern SCP, a gate electrode GE, a first terminal TE1, and a second terminal TE2. The first terminal TE1 may be any one of a source electrode and a drain electrode, and the second terminal TE2 may be the other of the source electrode and the drain electrode. For example, when the first terminal TE1 is the drain electrode, the second terminal TE2 may be the source electrode.

The semiconductor pattern SCP may be provided and/or formed on the buffer layer BFL. The semiconductor pattern SCP may include a first contact region that contacts the first terminal TE1 and a second contact region that contacts the second terminal TE2. A region between the first contact region and the second contact region may be a channel region. The channel region may overlap the gate electrode GE of a corresponding transistor T. The transistor semiconductor pattern SCP may be made of poly-silicon, amorphous silicon, oxide semiconductor, etc. The channel region is a semiconductor pattern undoped with an impurity, and may be an intrinsic semiconductor. Each of the first contact region and the second contact region may be a semiconductor pattern doped with the impurity.

The gate electrode GE may be provided and/or formed on the gate insulating layer GI to correspond to the channel region of the semiconductor pattern SCP. The gate electrode GE may be disposed on the gate insulating layer GI to overlap the channel region of the semiconductor pattern SCP. The gate electrode GE may be formed in a single layer including one selected from the group consisting of copper (Cu), molybdenum (Mo), tungsten (W), aluminum neodymium (AlNd), titanium (Ti), aluminum (Al), silver (Ag), and any alloy thereof or a mixture thereof, or be formed in a double- or multi-layered structure including molybdenum (Mo), titanium (Ti), copper (Cu), aluminum (Al) or silver (Ag), which is a low-resistance material so as to decrease wiring resistance.

The gate insulating layer GI may be an inorganic insulating layer including an inorganic material. For example, the gate insulating layer GI may include at least one of silicon nitride ($SiN_x$), silicon oxide ($SiO_x$), silicon oxynitride ($SiO_xN_y$), and metal oxide such as aluminum oxide ($AlO_x$). However, the material of the gate insulating layer GI is not limited to the above-described embodiments. In some embodiments, the gate insulating layer GI may be an organic insulating layer including an organic material. The gate insulating layer GI may be provided as a single layer, but be provided as a multi-layer including at least two layers.

The first terminal TE1 and the second terminal TE2 may be provided and/or formed on the interlayer insulating layer ILD, and be respectively contact the first contact region and the second contact region of the semiconductor pattern SLP through contact holes sequentially penetrating the gate insulating layer GI and the interlayer insulating layer ILD. For example, the first terminal TE1 may contact the first contact region of the semiconductor pattern SCP, and the second terminal TE2 may contact the second contact region of the semiconductor pattern SCP. Each of the first and second terminals TE1 and TE2, and the gate electrode GE may include the same material or include at least one material selected from the materials included in the gate electrode GE.

The interlayer insulating layer ILD may include the same material as the gate insulating layer GI or include at least one selected from the materials included in the gate insulating layer GI.

Although it has been described that the first and second terminals TE1 and TE2 of each of the transistors T are separate electrodes electrically connected to the semiconductor pattern SCP through contact holes sequentially penetrating the gate insulating layer GI and the insulating layer ILD, the disclosure is not limited thereto. In some embodiments, the first terminal TE1 of each of the transistors T may be the first contact region adjacent to the channel region of the corresponding semiconductor pattern SCP, and the second terminal TE2 of each of the transistors may be the second contact region adjacent to the channel region of the corresponding semiconductor pattern SCP. The first terminal TE1 of the first transistor T1 as the driving transistor may be electrically connected to the light emitting elements LD through a separate connection means such as a bridge electrode.

In an embodiment, the transistors T may be implemented with a low temperature poly-silicon (LTPS) thin film transistor, but the disclosure is not limited thereto. In some embodiments, the transistors T may be implemented with an oxide semiconductor thin film transistor. Also, in the above-described embodiment, a case where the transistors T are implemented with a thin film transistor having a top gate structure has been described as an example. However, the disclosure is not limited thereto, and the structure of the transistors T may be variously modified.

In some embodiments, a bottom metal layer overlapping the first transistor T1 may be provided and/or formed between the substrate SUB and the buffer layer BFL. The bottom metal layer may be a first conductive layer among conductive layers disposed on the substrate SUB. Although not directly shown in the drawings, the bottom metal layer may be electrically connected to the first transistor T1, to widen the driving range of a predetermined voltage supplied to the gate electrode GE of the first transistor T1. For example, the bottom metal layer may be electrically and/or physically connected to one of the first and second terminals TE1 and TE2 of the first transistor T1.

The pixel circuit layer PCL may include a predetermined power line provided and/or formed on the interlayer insulating layer ILD. For example, the predetermined power line may include a second power line PL2. The second power line PL2 may be provided in the same layer as the first and second terminals TE1 and TE2 of each of the transistors T. The voltage of the second driving power source VSS may be applied to the second power line PL2. Although not directly shown in FIGS. 8 to 12, the pixel circuit layer PCL may further include a first power line PL1. The first power line PL1 may be provided in the same layer as the second power line PL2 or be provided in a layer different from that of the second power line PL2. In the above-described embodiment, it has been described that the second power line PL2 is provided and/or formed on the interlayer insulating layer ILD, but the disclosure is not limited thereto. In some embodiments, the second power line PL2 may be provided in the same layer as any one conductive layer among the conductive layers provided in the pixel circuit layer PCL. The position of the second power line PL2 in the pixel circuit layer PCL may be variously changed.

Each of the first power line PL1 and the second power line PL2 may include a conductive material (or substance). For example, each of the first power line PL1 and the second power line PL2 may be formed in a single layer including one selected from the group consisting of copper (Cu), molybdenum (Mo), tungsten (W), aluminum neodymium (AlNd), titanium (Ti), aluminum (Al), silver (Ag), and any alloy thereof or a mixture thereof, or be formed in a double- or multi-layered structure including molybdenum (Mo), titanium (Ti), copper (Cu), aluminum (Al) or silver (Ag), which is a low-resistance material so as to decrease wiring resistance. For example, each of the first power line PL1 and the second power line PL2 may be configured as a double layer in which titanium (Ti)/copper (Cu) are sequentially stacked.

The first power line PL1 may be electrically connected to a component of the display element layer DPL, and the second power line PL2 may be electrically connected to another component of the display element layer DPL.

The passivation layer PSV may be provided and/or formed over the transistors T and the second power line PL2.

The passivation layer PSV (also, referred to as a "protective layer" or "via layer") may be an inorganic layer (or inorganic insulating layer) including an inorganic material or an organic layer (or organic insulating layer) including an organic material. The inorganic insulating layer may include, for example, at least one of silicon oxide ($SiO_x$), silicon nitride ($SiN_x$), silicon oxynitride ($SiO_xN_y$), and metal oxide such as aluminum oxide ($AlO_x$). For example, the organic insulating layer may include at least one of polyacrylates resin, epoxy resin, phenolic resin, polyamides resin, polyimides resin, unsaturated polyesters resin, polyphenylene ethers resin, poly-phenylene sulfides resin, and benzocyclobutene resin.

In some embodiments, the passivation layer PSV and the interlayer insulating layer ILD may include the same materials, but the disclosure is not limited thereto. The passivation layer PSV may be provided as a single layer, but be provided as a multi-layer including at least two layers. The passivation layer PSV may include a first contact part CNT1 exposing the first terminal TE1 of the first transistor T1 and a second contact part CNT2 exposing a portion of the second power line PL2.

The display element layer DPL may be provided and/or formed on the passivation layer PSV.

The display element layer DPL may include conductive patterns CP, bank patterns BNP, alignment electrodes ALE, a bank BNK, light emitting elements LD, pixel electrodes PE, and intermediate electrodes CTE. The display element layer DPL may include at least one insulating layer located between the above-described components. For example, the display element layer DPL may include a first insulating layer INS1, a second insulating layer INS2, a third insulating layer INS3, and a fourth insulating layer INS4. In some embodiments, the third insulating layer INS3 may be selectively provided.

The conductive patterns CP may be disposed on a surface of the pixel circuit layer PCL. For example, the conductive patterns CP may be disposed on a surface of the passivation layer PSV. The conductive patterns CP may have the same thickness in the third direction DR3, and be simultaneously formed through the same process.

The conductive patterns CP may be made of a conductive material (or substance). For example, the conductive patterns CP may include a transparent conductive material. The transparent conductive material (or substance) may include a conductive oxide such as indium tin oxide (ITO), indium zinc oxide (IZO), zinc oxide (ZnO), indium gallium zinc oxide (IGZO), or indium tin zinc oxide (ITZO), a conductive polymer such as (poly(3,4-ethylenedioxythiophene) PEDOT, and the like. However, the material of the conductive patterns CP is not limited to the above-described materials.

A first conductive pattern CP1 may be electrically connected to the first transistor T1 through the first contact part CNT1, and a third conductive pattern CP3 may be electrically connected to the second power line PL2 through the second contact part CNT2.

In an embodiment, the first conductive pattern CP1 is disposed on a surface of the passivation layer PSV, and may extend toward the non-emission area NEMA from the emission area EMA along the first direction DR1 to be adjacent to the bank BNK. The first conductive pattern CP1 may have a width d1 greater than that of each of a first bank pattern BNP1 and a first alignment electrode ALE1, which are located on the top thereof, in the first direction DR1. A second conductive pattern CP2 is disposed on a surface of the passivation layer PSV, and may extend toward the non-emission area NEMA from the emission area EMA along the first direction DR1 to be adjacent to the bank BNK. The second conductive pattern CP2 may have a width d2 greater than that of each of a third bank pattern BNP3 and a fourth alignment electrode ALE4, which are located on the top thereof, in the first direction DR1.

As described above, when the first and second conductive patterns CP1 and CP2 extend to be adjacent to the bank BNK, each of the first and second conductive patterns CP1 and CP2 may be used as a shielding member which blocks electric fields induced from components (e.g., transistors T and signal lines electrically connected to the transistors T) located in the pixel circuit layer PCL.

The bank patterns BNP may be provided and/or formed on the first conductive pattern CP1 and the second conductive pattern CP2, and the passivation layer PSV.

The bank patterns BNP may be disposed on the surfaces of at least one conductive pattern CP and the passivation layer PSV. For example, the bank patterns BNP may protrude in the third direction DR3 on a surface of each of the first conductive pattern CP1, the second conductive pattern CP2, and the passivation layer PSV. Accordingly, an area of an alignment electrode ALE disposed on the bank patterns BNP may protrude in the third direction DR3 (or a thickness direction of the substrate SUB).

The bank patterns BNP may be an inorganic insulating layer including an inorganic material or an organic insulating layer including an organic material. In some embodiments, the bank patterns BNP may include an organic insulating layer provided as a single layer and/or an inorganic insulating layer provided as a single layer, but the disclosure is not limited thereto. In some embodiments, the bank patterns BNP may be provided in the form of a multi-layer in which at least one organic insulating layer and at least one inorganic insulating layer are stacked with each other. However, the material of the bank patterns BNP is not limited to the above-described embodiment. In some embodiments, the bank patterns BNP may include a conductive material (or substance).

The bank patterns BNP may have a section having a trapezoidal shape of which width becomes narrower toward the top thereof along the third direction DR3 from a surface (e.g., an upper surface) of each of the first conductive pattern CP1, the second conductive pattern CP2, and the passivation layer PSV, but the disclosure is not limited thereto. In some embodiments, the bank patterns BNP may include a curved surface having a section of a semi-elliptical shape, a semi-circular shape (or hemispherical shape), or the like, of which width becomes narrower toward the top thereof along the third direction DR3 from one surface of each of the first conductive pattern CP1, the second conductive pattern CP2, and the passivation layer PSV. In a cross-section view, the shape of the bank patterns BNP is not limited to the above-described embodiments, and may be variously changed within a range in which the efficiency of light emitted from each of the light emitting elements LD may be improved. Also, in some embodiments, at least one of the bank patterns BNP may be omitted, or the position of the at least one of the bank patterns BNP may be changed.

The first bank pattern BNP1 may be located on at least a portion of the first conductive pattern CP1 and the passivation layer PSV, and partially overlap the first conductive pattern CP1. The third bank pattern BNP3 may be located on at least a portion of the second conductive pattern CP2 and the passivation layer PSV, and partially overlap the second conductive pattern CP2.

In an embodiment, the bank patterns BNP may be used as a reflection member. For example, the bank patterns BNP along with the alignment electrodes ALE disposed on the top thereof may be used as a reflection member which guides light emitted from each light emitting element LD in a desired direction, thereby improving the light emission efficiency of the pixel PXL.

The alignment electrodes ALE may be provided and/or formed on the bank patterns BNP.

The first alignment electrode ALE1 may be provided and/or formed on the passivation layer PSV and the first bank pattern BNP1. Also, the first alignment electrode ALE1 may be provided and/or formed on an area of the first conductive pattern CP1, which does not overlap the first bank pattern BNP1, to be connected to the first conductive pattern CP1 while being in direct contact with the first conductive pattern CP1. A second alignment electrode ALE2 may be provided and/or formed on the passivation layer PSV and a second bank pattern BNP2. A third alignment electrode ALE3 may be disposed on the passivation layer PSV and the second bank pattern BNP2. The fourth alignment electrode ALE4 may be provided and/or formed on the passivation layer PSV and the third bank pattern BNP3. Also, the fourth alignment electrode ALE4 may be provided and/or formed on an area of the second conductive pattern CP2, which does not overlap the third bank pattern BNP3, to be connected to the second conductive pattern CP2 while being in direct contact with the second conductive pattern CP2.

The first alignment electrode ALE1 may have a shape corresponding to a gradient of the first bank pattern BNP1 located on the bottom thereof, the second alignment electrode ALE2 may have a shape corresponding to a gradient of the second bank pattern BNP2 located on the bottom thereof, a third alignment electrode ALE3 may have a shape corresponding to a gradient of the second bank pattern BNP2 located on the bottom thereof, and the fourth alignment electrode ALE4 may have a shape corresponding to a gradient of the third bank pattern BNP3 located on the bottom thereof.

The alignment electrodes ALE may be disposed on the same plane, and have the same thickness in the third direction DR3. Also, the alignment electrodes ALE may be simultaneously formed through the same process.

The alignment electrodes ALE may be made of a material having a constant (or uniform) reflexibility so as to allow light emitted from the light emitting elements LD to be transmitted in the image display direction of the display device. For example, the alignment electrodes ALE may be made of a conductive material. The conductive material (or substance) may include an opaque metal advantageous in reflecting light emitted from the light emitting elements LD in the image display direction of the display device. The opaque metal may include, for example, metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. However, the material of the alignment electrodes ALE is not limited to the above-described embodiment.

Each of the alignment electrodes ALE may be provided and/or formed as a single layer, but the disclosure is not limited thereto. In some embodiments, each of the alignment electrodes ALE may be provided and/or formed as a multi-layer in which at least two materials among metals, alloys, conductive oxide, and conductive polymers are stacked with each other. Each of the alignment electrodes ALE may be formed as a multi-layer having at least two layers so as to minimize distortion caused by a signal delay when a signal (or voltage) is transferred to both end portions EP1 and EP1 of each of the light emitting elements LD. For example, each of the alignment electrodes ALE may include at least one reflective electrode layer. Also, each of the alignment electrodes ALE may selectively further include at least one of at least one transparent electrode layer disposed on the top and/or the bottom of the reflective electrode layer and at least one conductive capping layer covering the top of the transparent electrode layer.

As described above, when the alignment electrodes ALE are made of a conductive material having a constant reflexibility, the alignment electrodes ALE enable light emitted from both the end portions, i.e., first and second end portions EP1 and EP2 of each of the light emitting elements LD to be transmitted in the image display direction (or the third direction DR3) of the display device. When the alignment electrodes ALE are disposed to face the first and second end portions EP1 and EP2 of the light emitting elements LD while having a gradient or curved surface corresponding to the shape of the bank pattern BNP, the light emitted from the first and second end portions EP1 and EP2 of each of the light emitting elements LD is reflected by the alignment electrodes ALE, to be transmitted in the image display direction of the display device. Accordingly, the efficiency of light emitted from the light emitting elements LD may be improved.

The first insulating layer INS1 may be provided and/or formed over the alignment electrodes ALE.

The first insulating layer INS1 may be partially opened to expose at least the emission area EMA and/or components located on the bottom thereof in at least the non-emission area NEMA. For example, the first insulating layer INS1 may be partially opened to include a first contact hole CH1 exposing a portion of the first conductive pattern CP1 as one area of the first insulating layer INS1 is removed in the emission area EMA and a second contact hole CH2 exposing a portion of the third alignment electrode ALE3 as another area of the first insulating layer INS1 is removed in the non-emission area NEMA (or a second opening OP2 of the bank BNK).

The first insulating layer INS1 may include an inorganic insulating layer made of an inorganic material or an organic insulating layer made of an organic material. The first insulating layer INS1 may be configured as an inorganic insulating layer advantageous in protecting the light emitting elements LD from the pixel circuit layer PCL. For example, the first insulating layer INS1 may include at least one of silicon oxide ($SiO_x$), silicon nitride ($SiN_x$), silicon oxynitride ($SiO_xN_y$), and metal oxide such as aluminum oxide ($AlO_x$), but the disclosure is not limited thereto. In some embodiments, the first insulating layer INS1 may be configured as an organic insulating layer advantageous in planarizing a supporting surface of the light emitting elements LD.

The first insulating layer INS1 may be provided as a single layer or a multi-layer. When the first insulating layer INS1 is provided as the multi-layer, the first insulating layer INS1 may be provided in a distributed Bragg reflector (DBR) in which a first layer and a second layer, which are configured as inorganic insulating layers having different refractive indices, are alternately stacked. For example, the first insulating layer INS may be provided in a structure in which the first layer having a low refractive index and the second layer having a refractive index higher than that of the first layer are alternately stacked. As described above, when the first insulating layer INS1 is provided as the multi-layer, the first insulating layer INS1 may be used as a reflection member which reflects light emitted from the light emitting elements LD in a desired direction by using constructive interference caused by a refractive index difference between the first layer and the second layer. Each of the first and second layers may include at least one of silicon oxide ($SiO_x$), silicon nitride ($SiN_x$), silicon oxynitride ($SiO_xN_y$), silicon oxycabonitride ($SiO_xC_y$), silicon carbonitride ($SiC_xN_y$), aluminum oxide ($AlO_x$), aluminum nitride ($AlN_x$), hafnium oxide ($HfO_x$), zirconium oxide ($ZrO_x$), titanium oxide ($TiO_x$), and tantalum oxide ($TaO_x$).

The bank BNK may be provided and/or formed on the first insulating layer INS1.

The bank BNK may be formed between other pixels PXL to surround the emission area EMA of a pixel PXL. Therefore, the bank BNK may constitute a pixel defining layer partitioning the emission area EMA of the corresponding pixel PXL. The bank BNK may serve as a dam structure which prevent a liquid solution in which light emitting elements LD are mixed from being introduced to an emission area EMA of an adjacent pixel PXL, or may control a constant amount of liquid solution to be supplied to each emission area EMA, in the process of forming the light emitting elements LD to the emission area EMA.

Light emitting elements LD may be supplied and aligned in an emission area EMA of a pixel PXL, in which the first insulating layer INS1 is formed. For example, the light emitting elements LD may be supplied (or input) to the emission area EMA in a liquid solution through an inkjet printing process or the like, and be aligned between the alignment electrodes ALE by a predetermined alignment voltage (or alignment signal) applied to each of the alignment electrodes ALE. The same alignment signal may be applied to the first alignment electrode ALE1 and the fourth alignment electrode ALE4. For example, a ground voltage may be applied to the first alignment electrode ALE1 and the fourth alignment electrode ALE4. The same alignment signal may be applied to the second alignment electrode ALE2 and the third alignment electrode ALE3. For example, an AC signal may be applied to the second alignment electrode ALE2 and the third alignment electrode ALE3. In case that the alignment signal is applied to the alignment electrodes ALE, an electric field may be formed between the alignment electrodes, and the electric field may pull and reorient the light emitting elements LD that are mixed (or suspended or floating) in the liquid solution. The light emitting elements LD may be positioned and aligned between the alignment electrodes due to the electric field. After the light emitting elements LD are positioned and aligned, the liquid solution may be removed (e.g., evaporated) leaving the light emitting elements LD aligned between the alignment electrodes ALE.

The second insulating layer INS2 may be provided and/or formed on the light emitting elements LD in the emission area EMA. The second insulating layer INS2 is provided and/or formed on the light emitting elements LD to partially cover an outer circumferential surface (or surface) of each of the light emitting elements LD and to expose the first end portion EP1 and the second end portion EP2 of each of the light emitting elements LD to the outside.

The second insulating layer INS2 may be configured as a single layer or a multi-layer, and include an inorganic insulating layer including at least one inorganic material or an organic insulating layer including at least one organic material. The second insulating layer INS2 may include an inorganic insulating layer advantageous in protecting the active layer 12 (refer to "12" shown in FIG. 1) of each of the light emitting elements LD from external oxygen, moisture, and the like. However, the disclosure is not limited thereto. The second insulating layer INS2 may be configured as an organic insulating layer including an organic material according to design conditions of the display device to which the light emitting elements LD are applied. After alignment of light emitting elements LD in the pixel area PXA (or emission area EMA) of the pixel PXL is completed, the second insulating layer INS2 is formed on the light emitting elements LD, so that the light emitting elements LD may be prevented from being moved (or disturbed) from positions at which the light emitting elements LD are aligned.

When an empty gap (or space) exists between the first insulating layer INS1 and the light emitting elements LD before the second insulating layer INS2 is formed, the empty gap may be filled with the second insulating layer INS2 in a process of forming the second insulating layer INS2. The second insulating layer INS2 may be configured as an organic insulating layer advantageous in filling the empty gap between the first insulating layer INS1 and the light emitting elements LD, but the disclosure is not necessarily limited thereto.

The third insulating layer INS3 may be disposed to cover any one of the pixel electrodes PE and at least one of the intermediate electrodes CTE, which are disposed on the first and second end portions EP1 and EP2 of the light emitting elements LD. For example, as shown in FIGS. 8 and 10, the third insulating layer INS3 may be disposed on first and second pixel electrodes PE1 and PE2 to cover each of the first and second pixel electrodes PE1 and PE2. The third insulating layer INS3 may include an inorganic insulating layer made of an inorganic material or an organic insulating layer made of an organic material. For example, the third insulating layer INS2 may include at least one of silicon oxide ($SiO_x$), silicon nitride ($SiN_x$), silicon oxynitride ($SiO_xN_y$), and metal oxide such as aluminum oxide ($AlO_x$), but the disclosure is not limited thereto. Also, the third insulating layer INS3 may be formed as a single layer or a multi-layer.

When the second insulating layer INS2 and/or the third insulating layer INS3 are/is formed on the top of the light emitting elements LD, the electrical stability between the first and second end portions EP1 and EP2 of the light emitting elements LD may be ensured. For example, a pixel electrode PE and an intermediate electrode CTE, which are adjacent to each other, may be stably separated from each other by the second insulating layer INS2 and/or the third insulating layer INS3. Accordingly, a short-circuit defect may be prevented from occurring between the first and second end portions EP1 and EP2 of the light emitting elements LD.

As shown in FIG. 9, the third insulating layer INS3 may not be provided in an embodiment in which the pixel electrodes PE and the intermediate electrodes CTE are disposed in the same layer.

The pixel electrodes PE may be disposed on the light emitting elements LD, the second insulating layer INS2 on the light emitting elements LD, and the first insulating layer INS1 on the alignment electrodes ALE in at least the emission area EMA.

The first pixel electrode PE1 may be disposed on a first end portion EP1 of a first light emitting element LD1, the second insulating layer INS2 on the first light emitting element LD1, and the first insulating layer INS1 on the first alignment electrode ALE1 in at least the emission area EMA. Also, the first pixel electrode PE1 may be disposed on the first conductive pattern CP1 exposed by the first contact hole CH1 in at least the emission area EMA. The first pixel electrode PE1 may be electrically connected to the first conductive pattern CP1 while directly contacting the first conductive pattern CP1 by the first contact hole CH1.

The second pixel electrode PE2 may be disposed on a second end portion EP2 of a fourth light emitting element LD4, the second insulating layer INS2 on the fourth light emitting element LD4, and the first insulating layer INS1 on the third alignment electrode ALE3 in at least the emission area EMA. Also, the second pixel electrode PE2 may be disposed on the third alignment electrode ALE3 exposed by the second contact hole CH2 in at least the second opening OP2 (or non-emission area NEMA). The second pixel electrode PE2 may be electrically connected to the third alignment electrode ALE3 and the third conductive pattern CP3 located under the third alignment electrode ALE3 while contacting the third alignment electrode ALE3 by the second contact hole CH2.

The first pixel electrode PE1 and the second pixel electrode PE2 may be formed through the same process to be provided in the same layer. However, the disclosure is not limited thereto. In some embodiments, the first pixel electrode PE1 and the second pixel electrode PE2 may be formed through different processes to be provided in different layers.

The pixel electrodes PE may be made of various transparent conductive materials. For example, the pixel electrodes PE may include at least one of various transparent conductive materials (or substances) including indium tin oxide (ITO), indium zinc oxide (IZO), zinc oxide (ZnO), indium gallium zinc oxide (IGZO), indium tin zinc oxide (ITZO), and the like, and be substantially transparent or translucent to satisfy a predetermined transmittance (or transmittancy). However, the material of the pixel electrodes PE is not limited to the above-described embodiment. In some embodiments, the pixel electrodes PE may be made of various opaque conductive materials (or substances). The pixel electrodes PE may be formed as a single layer or a multi-layer. In some embodiments, the pixel electrodes PE and the conductive patterns CP may include the same material.

At least one of the intermediate electrodes CTE may be formed through the same process as the pixel electrodes PE to be formed in the same layer as the pixel electrodes PE, and the other of the intermediate electrodes CTE may be formed through a process different from that of the pixel electrodes PE to be formed in different layers. For example, first and third intermediate electrodes CTE1 and CTE3 may be formed on the third insulating layer INS3 to be spaced apart from the pixel electrodes PE covered by the third insulating layer INS3. A second intermediate electrode CTE2 may be formed through the same process as the pixel electrodes PE to be provided in the same layer. However, the disclosure is not limited to the above-described embodiments. In some embodiments, all the first, second, and third intermediate electrodes CTE1, CTE2, and CTE3 may be formed through the same process as the pixel electrodes PE to be provided in the same layer.

The intermediate electrodes CTE may be made of various transparent conductive materials. The intermediate electrodes CTE and the pixel electrodes PE may include the same material or include at least one of the materials included in the pixel electrodes PE.

The fourth insulating layer INS4 may be provided and/or formed over the intermediate electrodes CTE. The fourth insulating layer INS4 may be an inorganic insulating layer including an inorganic material or an organic insulating layer including an organic material. For example, the fourth insulating layer INS4 may have a structure in which at least one inorganic insulating layer and at least one organic insulating layer are alternately stacked. The fourth insulating layer INS4 entirely covers the display element layer DPL, to block moisture, humidity, or the like from being introduced to the display element layer DPL including the light emitting elements LD from the outside. In some embodiments, at least one overcoat layer (e.g., a layer planarizing a top surface of the display element layer DPL) may be further disposed on the top of the fourth insulating layer INS4.

In some embodiments, an upper substrate may be further disposed on the fourth insulating layer INS. The upper substrate may be disposed on the display element layer DPL to cover the display area DA of the substrate SUB on which the pixel PXL is disposed. An intermediate layer CTL may be disposed on the display element layer DPL.

The intermediate layer CTL may be a transparent adhesive layer (or cohesive layer), e.g., an optically clear adhesive for reinforcing adhesion between the display element layer DPL and the upper substrate, but the disclosure is not limited thereto. In some embodiments, the intermediate layer CTL may be a refractive index conversion layer for converting the refractive index of light which is emitted from the light emitting elements LD and then is transmitted toward the upper substrate, thereby improving the light emission luminance of each pixel PXL.

The upper substrate may be configured as an encapsulation substrate (or thin film encapsulation layer) and/or a window member of the display device. The upper substrate may include a based layer BSL and a light conversion pattern layer LCP.

The base layer BSL may be a rigid substrate or a flexible substrate, and the material or property of the base layer BSL is not particularly limited. The base layer BSL may be made of the same material as the substrate SUB or be made of a material different from that of the substrate SUB.

The light conversion pattern layer LCP may be disposed on one surface of the base layer BSL to face the pixels PXL of the substrate SUB. The light conversion pattern layer LCP may include a color conversion layer CCL and a color filter CF.

The color conversion layer CCL may include color conversion particles QD corresponding to a color. The color filter CF may allow light of the color to be selectively transmitted therethrough.

The color conversion layer CCL may be disposed on the one surface of the base layer BSL to face a pixel PXL, and include color conversion particles QD for converting light of a first color, which is emitted from light emitting elements LD disposed in the corresponding pixel PXL, into light of a second color. For example, when the pixel PXL is a red pixel (or red sub-pixel), the color conversion layer CCL of the corresponding pixel PXL may include color conversion particles QD of a red quantum dot, which convert light of a first color, which is emitted from the light emitting elements LD, into light of a second color, e.g., red light. In another example, when the pixel PXL is a green pixel (or green sub-pixel), the color conversion layer CCL of the corresponding pixel PXL may include color conversion particles QD of a green quantum dot, which convert light of a first color, which is emitted from the light emitting elements LD, into light of a second color, e.g., green light. In another example, when the pixel PXL is a blue pixel (or blue sub-pixel), the color conversion layer CCL of the corresponding pixel PXL may include color conversion particles QD of a blue quantum dot, which convert light of a first color, which is emitted from the light emitting elements LD, into light of a second color, e.g., blue light. In some embodiments, when the pixel PXL is the blue pixel (or blue sub-pixel), a light scattering layer including light scattering particles may be provided instead of the color conversion layer CCL including the color conversion particles QD. For example, when the light emitting elements LD emit blue series light, the pixel PXL may include a light scattering layer including light scattering particles. The above-described light scattering layer may be omitted in some embodiments. In other embodiments, when the pixel PXL is a blue pixel (or blue sub-pixel), a transparent polymer may be provided instead of a color conversion layer CCL.

The color filter CF may selectively transmit light of a color. The color filter CF along with the color conversion layer CCL constitute the light conversion pattern layer LCP, and may include a color filter material for allowing light converted by the color conversion layer CCL, to be selectively transmitted therethrough. The color filter CF may include a red color filter, a green color filter, and a blue color filter. The above-described color filter CF may be provided in the pixel area PXA of the pixel PXL to correspond to the color conversion layer CCL.

The light conversion pattern layer LCP including the color conversion layer CCL and the color filter CF may correspond to the emission area EMA of the pixel PXL.

A first light blocking pattern LBP1 may be disposed between color filters CF of adjacent pixels PXL. The first light blocking pattern LBP1 may be disposed on a surface of the base layer BSL to overlap the bank BNK provided in the pixel area PXA of the pixel PXL.

In some embodiments, the first light blocking pattern LBP1 may be provided in multiple layers in which at least two color filters which allow lights of different colors to be selectively transmitted therethrough among a red color filter, a green color filter, and a blue color filter overlap each other. For example, the first light blocking pattern LBP1 may be provided in a form include a red color filter, a green color filter overlapping the red color filter while being located on the red color filter, and a blue color filter overlapping the green color filter while being located on the green color filter. The first light blocking pattern LBP1 may be provided in the form of a structure in which a red color filter, a green color filter, and a blue color filter are sequentially stacked with each other. The red color filter, the green color filter, and the blue color filter may be used as the first light blocking pattern LBP1 which blocks transmission of light in the non-emission area of the pixel area PXA.

In some embodiments, a second light blocking pattern LBP2 may be disposed on the first light blocking pattern LBP1. For example, the first light blocking pattern LBP1 and the second light blocking pattern LBP2 may correspond to a black matrix.

In the above-described embodiment, it has been described that the upper substrate including the base layer BSL and the light conversion pattern layer LCP are provided at an upper portion of the pixel PXL, but the disclosure is not limited thereto. In some embodiments, the light conversion pattern layer LCP may be formed on the surface of the substrate SUB on which the pixel PXL is provided.

As described above, when at least one conductive pattern CP having an extending shape is electrically connected to the alignment electrode ALE while contacting the alignment electrode ALE with the bank pattern BNP interposed therebetween in at least the emission area EMA, electric fields introduced from the transistors T and the signal lines connected thereto may be blocked. Electric fields other than that of the alignment electrodes ALE may be blocked from affecting the alignment and positioning of the light emitting elements LD. Accordingly, misalignment of the light emitting elements LD may be prevented, and the light emitting elements LD may be prevented from being dislocated from positions at which the light emitting elements LD are aligned.

Further, when the first conductive pattern CP1 and the first pixel electrode PE1 are electrically connected to each other while directly contacting each other through the first contact hole CH1, the first pixel electrode PE1 may not be directly connected to the first alignment electrode ALE but may be indirectly connected to the first alignment electrode ALE1 through the first conductive pattern CP1, so that contact resistance of the first pixel electrode PE1 may not be increased.

Figure 13:
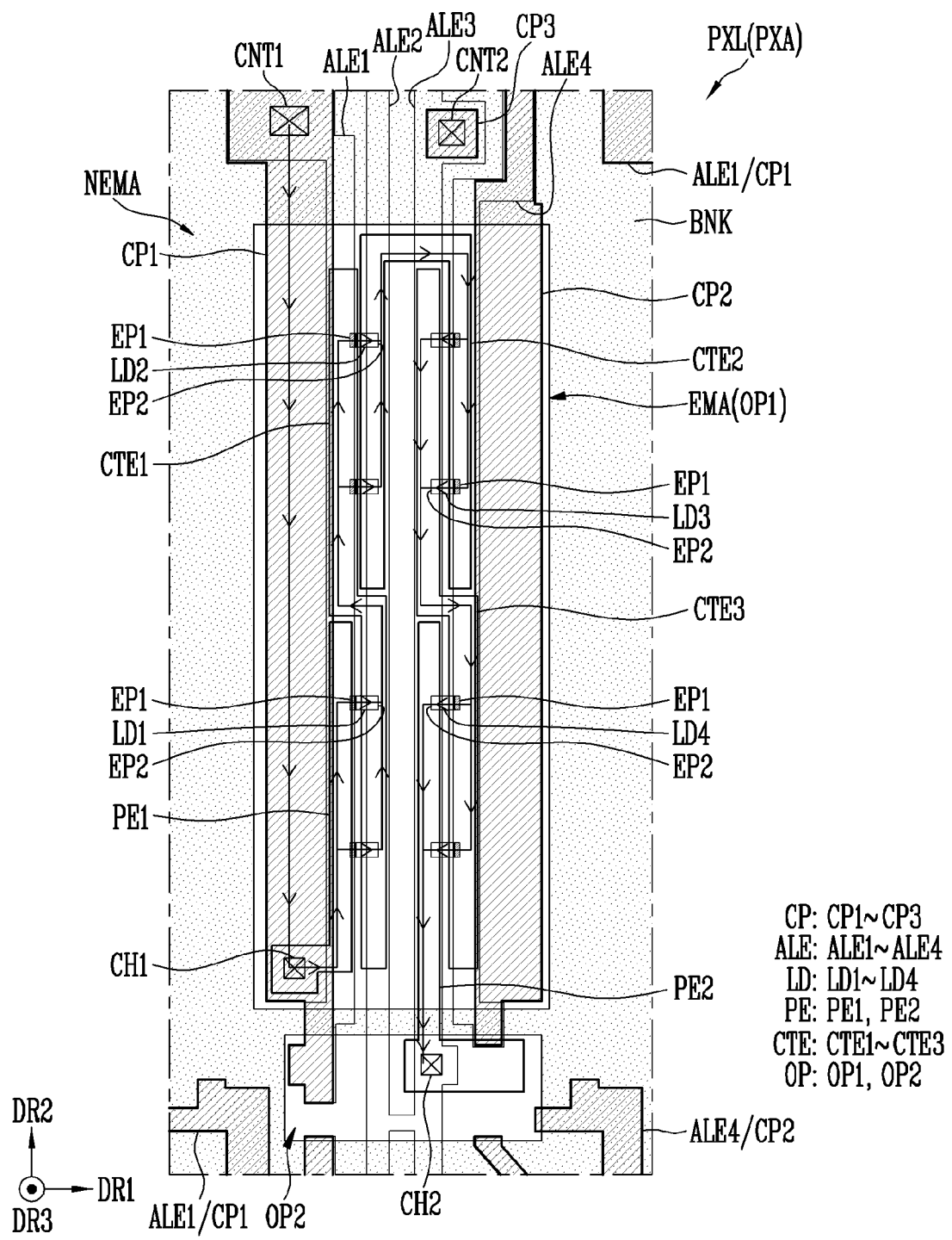
FIG. 13 is a schematic plan view illustrating a driving current flowing through a pixel in accordance with an embodiment of the disclosure, and illustrates, for example, a driving current flowing through the pixel shown in FIG. 6.

FIG. 13 is a plan view illustrating a driving current flowing through a pixel PXL in accordance with an embodiment of the disclosure, and illustrates, for example, a driving current flowing through the pixel PXL shown in FIG. 6.

Referring to FIGS. 4 to 13, when assuming that a driving current flows from the first power line PL1 to the second power line PL2 through the first transistor T1 included in the pixel PXL, the driving current may be introduced to the light emitting unit EMU of the pixel PXL through the first contact part CNT1.

For example, a driving current is supplied to the first conductive pattern CP1 and the first alignment electrode ALE1 through the first contact part CNT1. The driving current flows into the first intermediate electrode CTE1 via the first light emitting elements LD1 through the first pixel electrode PE1 directly contacting the first conductive pattern CP1 through the first contact hole CH1. Accordingly, the first light emitting elements LD1 may emit light with a luminance corresponding to a current distributed to each thereof in the first serial stage SET1.

The driving current flowing into the first intermediate electrode CTE1 flows into the second intermediate electrode CTE2 via the second light emitting elements LD2. Accordingly, the second light emitting elements LD2 may emit light with a luminance corresponding to a current distributed to each thereof in the second serial stage SET2.

The driving current flowing into the second intermediate electrode CTE2 flows into the third intermediate electrode CTE3 via the third light emitting elements LD3. Accordingly, the third light emitting elements LD3 may emit light with a luminance corresponding to a current distributed to each thereof in the third serial stage SET3.

The driving current flowing into the third intermediate electrode CTE3 flows into the second pixel electrode PE2 via the fourth light emitting elements LD4. Accordingly, the fourth light emitting elements LD4 may emit light with a luminance corresponding to a current distributed to each thereof in the fourth serial stage SET4.

In the above-described manner, the driving current of the pixel PXL may flow sequentially via the first light emitting elements LD1 of the first serial stage SET1, the second light emitting elements LD2 of the second serial stage SET2, the third light emitting elements LD3 of the third serial stage SET3, and the fourth light emitting elements LD4 of the fourth serial stage SET4. Accordingly, the pixel PXL may emit light with a luminance corresponding to a data signal supplied during each frame period.

Figure 14:
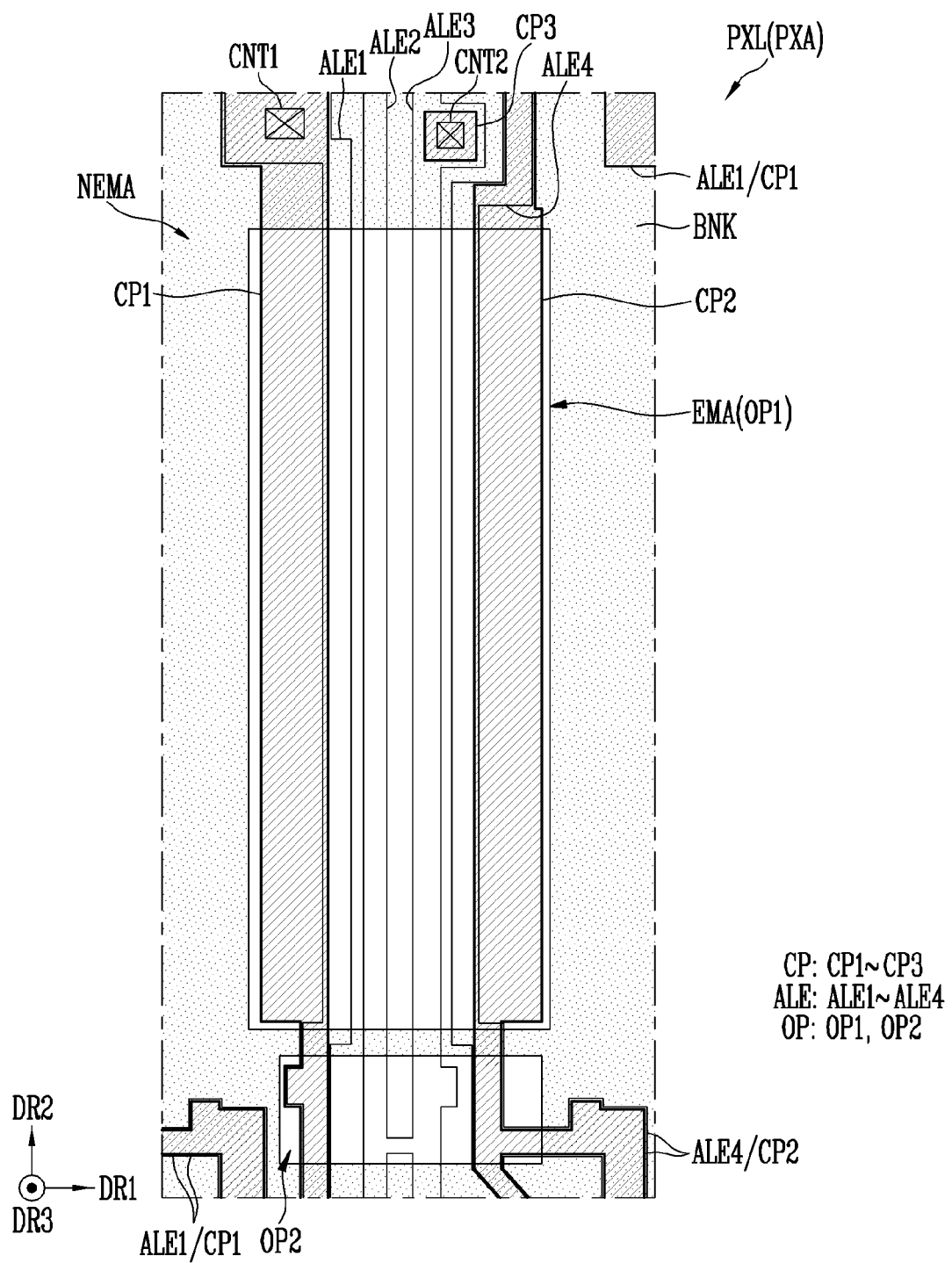
FIG. 14 is a plan view schematically illustrating a pixel before light emitting elements are aligned.

FIG. 14 is a plan view schematically illustrating a pixel PXL before light emitting elements LD are aligned.

In relation to the pixel PXL shown in FIG. 14, the descriptions of the embodiments will mainly focus on the portions that are different from those described above to avoid repetition.

Referring to FIGS. 4 to 14, before the light emitting elements LD are aligned in the pixel PXL, the alignment electrodes ALE may be supplied with an alignment signal from an external alignment pads (not shown).

The first alignment electrode ALE1 may be supplied with a first alignment signal from a first alignment pad. The first alignment signal may be, for example, a ground voltage. The second alignment electrode ALE2 may be supplied with a second alignment signal different from the first alignment signal from a second alignment pad. The second alignment signal may be, for example, an AC voltage. The third alignment electrode ALE3 may be connected to the second alignment electrode ALE2 such that the second alignment signal is applied from the second alignment electrode ALE2. The fourth alignment electrode ALE4 may be supplied with the first alignment signal from the first alignment pad or another alignment pad. The same first alignment signal may be applied to the first alignment electrode ALE1 and the fourth alignment electrode ALE4, and the same second alignment signal may be applied to the second alignment electrode ALE2 and the third alignment electrode ALE3.

A corresponding alignment signal is applied to each of the first to fourth alignment electrodes ALE1, ALE2, ALE3, and ALE4, so that an electric field is formed each of between the first alignment electrode ALE1 and the second alignment electrode ALE2 and between the third alignment electrode ALE3 and the fourth alignment electrode ALE4. Accordingly, light emitting elements LD may be aligned each of between the first alignment electrode ALE1 and the second alignment electrode ALE2 and between the third alignment electrode ALE3 and the fourth alignment electrode ALE4. The first and second conductive patterns CP1 and CP2 extending to be adjacent to the bank BNK prevent the light emitting elements LD from being separated at positions at which the light emitting elements LD are aligned by blocking electric fields induced from other components of the pixel circuit PXC. Accordingly, effective light sources of the pixel PXL may be further secured.

After the alignment of the light emitting elements LD is completed, each of a portion of the first alignment electrode ALE1 and a portion of the fourth alignment electrode ALE4 may be removed in the second opening OP2 of the bank BNK. Therefore, each of pixels PXL arranged on the same pixel column along the second direction DR2 may include first and fourth alignment electrodes ALE1 and ALE4 separated in a pixel unit.

Figure 15:
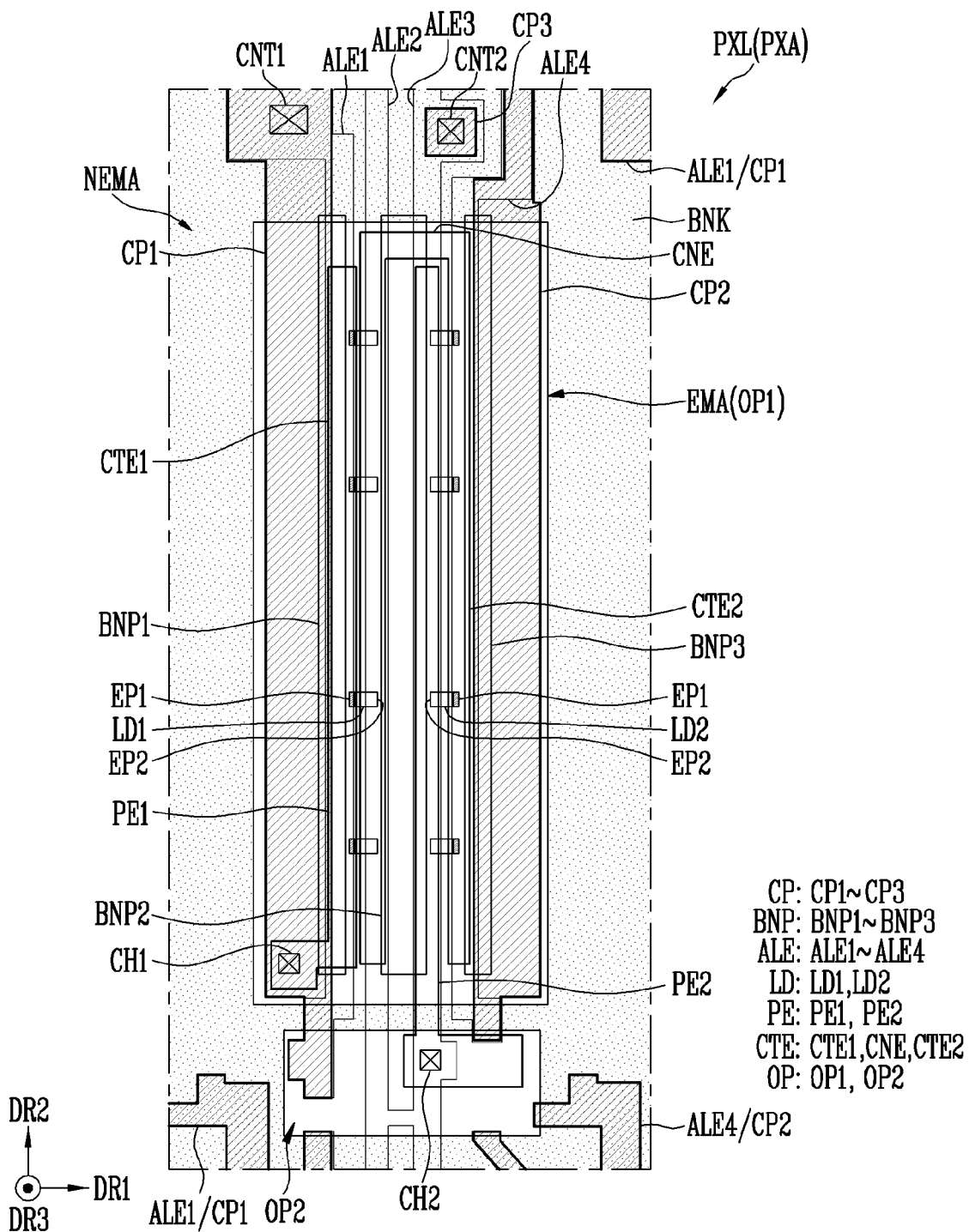
FIG. 15 is a schematic plan view of a pixel in accordance with an embodiment of the disclosure.

FIG. 15 is a schematic plan view of a pixel PXL in accordance with an embodiment of the disclosure.

In the embodiment shown in FIG. 15, a light emitting unit (refer to "EMU" shown in FIG. 5A) including two serial stages may be configured by changing the design of a pixel electrode PE. The structure of the light emitting unit EMU may be changed by variously changing the design of pixel electrodes PE.

In the embodiment shown in FIG. 15, the descriptions of the embodiments will mainly focus on the portions that are different from those described above to avoid repetition. Portions not described follow those described above. Identical reference numerals refer to identical components, and similar reference numerals refer to similar components.

Referring to FIGS. 5A and 15, the configuration of a light emitting unit EMU of a pixel PXL may be changed by changing the design of a pixel electrode PE and an intermediate electrode CTE. For example, the number of serial stages (or stages) constituting the light emitting unit EMU may be changed by changing the shapes, positions, numbers, and/or connection structures of the pixel electrode PE and the intermediate electrode CTE. A light emitting unit EMU including two serial stages may be configured by changing the design of a pixel electrode PE and an intermediate electrode CTE.

The pixel electrode PE may include a first pixel electrode PE1 and a second pixel electrode PE2.

The first pixel electrode PE1 may overlap a first alignment electrode ALE1 and first end portions EP1 of first light emitting elements LD1 aligned between the first alignment electrode ALE1 and a second alignment electrode ALE2. In an embodiment, the first pixel electrode PE1 may be directly connected to a first conductive pattern CP1 through a first contact hole CH1, and be indirectly connected to the first alignment electrode ALE1 through the first conductive pattern CP1. The first conductive pattern CP1 which directly contacts the first alignment electrode ALE1 while being located on the bottom of the first alignment electrode ALE1 in at least the non-emission area NEMA may be electrically connected to a first transistor T1 of the pixel circuit PXC through a first contact part CNT1. Also, the first pixel electrode PE1 may be connected to the first end portions EP1 of the first light emitting elements LD1 while being in direct or indirect contact with the first end portions EP1 of the first light emitting elements LD1.

The second pixel electrode PE2 may overlap a third alignment electrode ALE3 and second end portions EP2 of second light emitting elements LD2 aligned between the third alignment electrode ALE3 and a fourth alignment electrode ALE4. In an embodiment, the second pixel electrode PE2 may be connected to the third alignment electrode ALE3 and a third conductive pattern CP3 located on the bottom of the third alignment electrode ALE3 through a second contact hole CH2. The third alignment electrode ALE3 may be connected to a second power line PL2 through a second contact part CNT2 in at least the non-emission area NEMA. Also, the second pixel electrode PE2 may be connected to the second end portions EP2 of the second light emitting elements LD2 while being in direct or indirect contact with the second end portions EP2 of the second light emitting elements LD2.

The intermediate electrode CTE may include a first intermediate electrode CTE1, a second intermediate electrode CTE2, and a connection electrode CNE. The first intermediate electrode CTE1, the second intermediate electrode CTE2, and the connection electrode CNE may be provided integrally with each other, and may be connected to each other. In an embodiment, the first intermediate electrode CTE1, the second intermediate electrode CTE2, and the connection electrode CNE may be different areas of the intermediate electrode CTE.

The first intermediate electrode CTE1 may overlap second end portions EP2 of the first light emitting elements LD1 and at least an area of the second alignment electrode ALE2 corresponding thereto. The first intermediate electrode CTE1 may be connected to the second end portions EP2 of the first light emitting elements LD1 while being in direct or indirect contact with the second end portions EP2 of the first light emitting elements LD1. In a plan view, the first intermediate electrode CTE1 may be provided in a shape extending along the second direction DR2 between the first pixel electrode PE1 and the second pixel electrode PE2.

The second intermediate electrode CTE2 may overlap first end portions EP1 of the second light emitting elements LD2, at least one area of the fourth alignment electrode ALE4 corresponding thereto, and a second conductive pattern CP2 located on the bottom of the fourth alignment electrode ALE4. The second intermediate electrode CTE2 may be connected to the first end portions EP1 of the second light emitting elements LD2 while being in direct or indirect contact with the first end portions EP1 of the second light emitting elements LD2. In a plan view, the second intermediate electrode CTE2 may be provided in a shape extending along the second direction between the second pixel electrode PE2 and a bank BNK.

The connection electrode CNE may be provided between the first intermediate electrode CTE1 and the second intermediate electrode CTE2.

In a plan view, the intermediate electrode CTE including the first intermediate electrode CTE1, the connection electrode CNE, and the second intermediate electrode CTE2 may have a shape which is spaced apart from the first and second pixel electrodes PE1 and PE2, surrounds the periphery (or circumference) of the second pixel electrode PE2, and has any one portion which is opened. However, the disclosure is not limited thereto. In some embodiments, the intermediate electrode CTE may have a closed loop surrounding the periphery (or circumference) of the second pixel electrode PE2. The shape of the intermediate electrode CTE may be variously changed within a range in which two consecutive serial stages may be stably connected to each other.

The first pixel electrode PE1, the intermediate electrode CTE, and the second pixel electrode PE2 may be disposed to be spaced apart from each other on a plane.

The above-described pixel PXL may include a light emitting unit EMU configured with two serial stages.

In accordance with the disclosure, electric fields induced from the pixel circuit layer are blocked by disposing a conductive pattern between the alignment electrode (or alignment line) and the pixel circuit layer, so that the influence of electric field may be reduced or minimized, thereby preventing misalignment of light emitting elements.

Also, in accordance with the disclosure, an alignment electrode and a pixel electrode are electrically connected to each other through a conductive pattern, so that contact resistance of the pixel electrode is not increased. Accordingly, light emitting elements may be driven more stably, so that the reliability of the display device may be improved.

Embodiments have been disclosed herein, and although specific terms are employed, they are used and are to be interpreted in a generic and descriptive sense only and not for purpose of limitation. In some instances, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure as set forth in the following claims.

What is claimed is:

1. A pixel comprising:
   a first conductive pattern, a second conductive pattern, and a third conductive pattern that are spaced apart from each other, the first conductive pattern, the second conductive pattern, and the third conductive pattern belonging to a single pixel;
   a first electrode at least partially overlapping the first conductive pattern, and directly contacting the first conductive pattern;
   a second electrode adjacent to the first electrode;
   a third electrode adjacent to the second electrode, the third electrode disposed on the third conductive pattern, and directly contacting the third conductive pattern;
   a fourth electrode adjacent to the third electrode, the fourth electrode at least partially overlapping the second conductive pattern, and directly contacting the second conductive pattern;
   a first pixel electrode and a second pixel electrode that are disposed on at least one of the first electrode, the second electrode, the third electrode, and the fourth electrode, the first pixel electrode and the second pixel electrode being spaced apart from each other; and light emitting elements electrically connected to the first pixel electrode and the second pixel electrode, wherein
the first conductive pattern, the first electrode, and the first pixel electrode are electrically connected to each other, and
the third conductive pattern, the third electrode, and the second pixel electrode are electrically connected to each other.

2. The pixel of claim 1, further comprising:
a first bank pattern located between the first conductive pattern and the first electrode, the first bank pattern overlapping each of the first conductive pattern and the first electrode;
a second bank pattern located below the second electrode and the third electrode, the second bank pattern overlapping each of the second electrode and third electrode;
a third bank pattern located between the second conductive pattern and the fourth electrode, the third bank pattern overlapping each of the second conductive pattern and the fourth electrode; and
an insulating layer disposed on the first electrode, the second electrode, the third electrode, and the fourth electrode.

3. The pixel of claim 2, further comprising:
an emission area in which the light emitting elements are disposed;
a non-emission area adjacent to the emission area; and
a bank disposed in the non-emission area, the bank including a first opening corresponding to the emission area and a second opening spaced apart from the first opening, wherein
at least a portion of the first conductive pattern and at least a portion of the first electrode are separated in the second opening, and
at least a portion of the second conductive pattern and at least a portion of the fourth electrode are separated in the second opening.

4. The pixel of claim 3, wherein
the first conductive pattern overlaps at least a portion of the first electrode, extends along an extending direction of the first electrode, and is adjacent to the bank in the emission area, and
the second conductive pattern is spaced apart from the first conductive pattern, overlaps at least a portion of the fourth electrode, extends along an extending direction of the fourth electrode, and is adjacent to the bank.

5. The pixel of claim 4, wherein
the insulating layer includes:
a first contact hole exposing a portion of the first conductive pattern; and
a second contact hole exposing a portion of the third electrode,
the first contact hole is located in the first opening, and
the second contact hole is located in the second opening.

6. The pixel of claim 4, further comprising:
at least one transistor disposed on a substrate;
at least one power line disposed on the substrate, the at least one power line being supplied with a predetermined power source; and
a passivation layer disposed over the at least one transistor and the at least one power line, the passivation layer including a first contact part exposing a portion of the at least one transistor and a second contact part exposing a portion of the at least one power line.

7. The pixel of claim 6, wherein
at least a portion of the first conductive pattern overlaps the first contact part, and
the third conductive pattern overlaps the second contact part.

8. The pixel of claim 7, wherein
the first conductive pattern is electrically connected to the at least one transistor through the first contact part, and
the third conductive pattern is electrically connected to the at least one power line through the second contact part.

9. The pixel of claim 8, wherein
the first electrode is electrically connected to the at least one transistor and directly contacts the first conductive pattern, and
the third electrode is electrically connected to the at least one power line and directly contacts the third conductive pattern.

10. The pixel of claim 8, wherein the first contact part and the second contact part overlap the bank.

11. The pixel of claim 4, further comprising:
a color conversion layer located above the light emitting elements, the color conversion layer converting light of a first color into light of a second color, the light of the first color being emitted from the light emitting elements; and
a color filter located on the top of the color conversion layer,
wherein the light of the second color selectively transmits through the color filter.

12. The pixel of claim 4, further comprising: an intermediate electrode disposed on the insulating layer, the intermediate electrode spaced apart from the first pixel electrode and the second pixel electrode.

13. The pixel of claim 12, wherein
the intermediate electrode includes a first intermediate electrode, a second intermediate electrode, and a third intermediate electrode, which are disposed to be spaced apart from each other, and
at least one of the first intermediate electrode, the second intermediate electrode, and the third intermediate electrode and at least one of the first pixel electrode and the second pixel electrode are disposed on a same layer.

14. The pixel of claim 13, wherein the light emitting elements include:
a first light emitting element disposed between the first pixel electrode and the first intermediate electrode, the first light emitting element being electrically connected to the first pixel electrode and the first intermediate electrode;
a second light emitting element disposed between the first intermediate electrode and the second intermediate electrode, the second light emitting element being electrically connected to the first intermediate electrode and the second intermediate electrode;
a third light emitting element disposed between the second intermediate electrode and the third intermediate electrode, the third light emitting element being electrically connected to the second intermediate electrode and the third intermediate electrode; and
a fourth light emitting element disposed between the third intermediate electrode and the second pixel electrode, the fourth light emitting element being electrically connected to the third intermediate electrode and the second pixel electrode.

15. The pixel of claim 12, wherein
the intermediate electrode includes:
  a first intermediate electrode;
  a second intermediate electrode adjacent to the second pixel electrode; and
  a connection electrode connecting the first intermediate electrode and the second intermediate electrode to each other, and
the first intermediate electrode, the second intermediate electrode, and the connection electrode are integral with each other.

16. The pixel of claim 15, wherein the light emitting elements include:
  a first light emitting element disposed between the first pixel electrode and the first intermediate electrode, the first light emitting element being electrically connected to the first pixel electrode and the first intermediate electrode; and
  a second light emitting element disposed between the second intermediate electrode and the second pixel electrode, the second light emitting element being electrically connected to the second intermediate electrode and the second pixel electrode.

17. A display device comprising:
a substrate on which pixel areas are disposed, each of the pixel areas including an emission area and a non-emission area; and
a pixel located in each of the pixel areas, wherein
the pixel includes:
  a first conductive pattern, a second conductive pattern, and a third conductive pattern, spaced apart from each other on the substrate, the first conductive pattern, the second conductive pattern, and the third conductive pattern belonging to a single pixel;
  a first electrode at least partially overlapping the first conductive pattern, and directly contacting the first conductive pattern;
  a second electrode adjacent to the first electrode;
  a third electrode which is adjacent to the second electrode, the third electrode disposed on the third conductive pattern, and directly contacting the third conductive pattern;
  a fourth electrode adjacent to the third electrode and at least partially overlapping the second conductive pattern, and directly contacting the second conductive pattern;
  an insulating layer covering the first electrode, the second electrode, the third electrode, and the fourth electrode, the insulating layer including a first contact hole exposing a portion of the first conductive pattern and a second contact hole exposing a portion of the third electrode;
  a bank located on the insulating layer of the non-emission area, the bank having a first opening corresponding to the emission area and a second opening spaced apart from the first opening;
  a first pixel electrode and a second pixel electrode disposed on the insulating layer, the first pixel electrode and the second pixel electrode spaced apart from each other;
an intermediate electrode spaced apart from the first pixel electrode and from the second pixel electrode; and
light emitting elements electrically connected to the first pixel electrode, to the second pixel electrode, and to the intermediate electrode,
the first conductive pattern, the first electrode, and the first pixel electrode are electrically connected to each other, and
the third conductive pattern, the third electrode, and the second pixel electrode are electrically connected to each other.

18. The display device of claim 17, wherein
the first conductive pattern extends to be adjacent to the bank in the emission area,
the second conductive pattern is spaced apart from the first conductive pattern and is adjacent to the bank in the emission area, and
the first pixel electrode at least partially overlaps the first conductive pattern, and directly contacts the first conductive pattern through the first contact hole.

19. The pixel of claim 1, further comprising:
at least one transistor disposed on a substrate that provides current to all of the light emitting elements electrically connected to the first pixel electrode and the second pixel electrode.

* * * * *